United States Patent
Man

(10) Patent No.: US 9,384,941 B2
(45) Date of Patent: Jul. 5, 2016

(54) CHARGED PARTICLE BEAM APPARATUS AND SAMPLE OBSERVATION METHOD

(71) Applicant: HITACHI HIGH-TECH SCIENCE CORPORATION, Minato-ku, Tokyo (JP)

(72) Inventor: Xin Man, Tokyo (JP)

(73) Assignee: HITACHI HIGH-TECH SCIENCE CORPORATION (JP)

(*) Notice: Subject to any disclaimer, the term of this patent is extended or adjusted under 35 U.S.C. 154(b) by 0 days.

(21) Appl. No.: 14/601,478

(22) Filed: Jan. 21, 2015

(65) Prior Publication Data

US 2015/0206706 A1 Jul. 23, 2015

(30) Foreign Application Priority Data

Jan. 22, 2014 (JP) .................................. 2014-009915
Jan. 19, 2015 (JP) .................................. 2015-007781

(51) Int. Cl.
*H01J 37/26* (2006.01)
*G21K 5/04* (2006.01)
*H01J 37/20* (2006.01)
*H01J 37/28* (2006.01)
*H01J 37/305* (2006.01)

(52) U.S. Cl.
CPC ............... *H01J 37/20* (2013.01); *H01J 37/28* (2013.01); *H01J 37/3056* (2013.01); *H01J 2237/2007* (2013.01); *H01J 2237/20214* (2013.01); *H01J 2237/2802* (2013.01); *H01J 2237/31749* (2013.01)

(58) Field of Classification Search
USPC ................. 250/305, 306, 307, 309, 310, 311, 250/440.11, 441.11, 442.11, 443.1, 492.1, 250/492.3
See application file for complete search history.

(56) References Cited

U.S. PATENT DOCUMENTS

| | | | |
|---|---|---|---|
| 2007/0158564 A1* | 7/2007 | Tokuda et al. ................ 250/310 |
| 2009/0114842 A1 | 5/2009 | Takahashi et al. ........ 250/442.11 |
| 2011/0226948 A1 | 9/2011 | Tanaka et al. ................. 250/307 |
| 2013/0146765 A1* | 6/2013 | Kitayama et al. ............. 250/307 |
| 2013/0220806 A1* | 8/2013 | Iwaya ................. H01J 37/3005 204/298.32 |

FOREIGN PATENT DOCUMENTS

JP 2009110745 5/2009
JP 2011196802 10/2011

* cited by examiner

*Primary Examiner* — Nicole Ippolito
(74) *Attorney, Agent, or Firm* — Adams & Wilks

(57) ABSTRACT

A charged particle beam apparatus includes an electron beam column and an FIB column, in which an irradiation axis of the electron beam column and an irradiation axis of the FIB column are disposed to be perpendicular or substantially perpendicular to each other on a sample without interference. In addition, the first sample stage and a second sample stage are independently provided and moved to be tilted centering on an axial direction. The sample is moved by the first sample stage and a sample piece which is cut off from the sample is moved to be fixed to a tip end of a probe which is rotatable centering on the axial direction, thereby manufacturing the sample piece which reduces the influence of a curtaining effect.

8 Claims, 24 Drawing Sheets on the side of a holder and even though the sample
CHARGED PARTICLE BEAM APPARATUS AND SAMPLE OBSERVATION METHOD This application claims priorities from Japanese Patent Application No. 2014-009915 filed on Jan. 22, 2014 and Japanese patent Application No. 2015-007781 filed on Jan. 19, 2015, the entire subject-matters of which are incorporated herein by reference.

BACKGROUND

1. Technical Field

The disclosure relates to a charged particle beam apparatus which moves a sample piece processed by means of a charged particle beam to another sample holder, and a sample observation method.

2. Description of the Related Art

A transmission electron microscope (TEM) observation is known as a method of observing a fine area in a sample so as to perform a defect analysis of a semiconductor device. The TEM observation requires manufacture of a TEM sample having a thin film in which an electron beam can be transmitted to a portion of the sample as preparation of the sample for obtaining a transmission electron image. In recent years, as a method of manufacturing the TEM sample, a TEM sample manufacturing method by means of a focused ion beam (FIB) has been widely used. In this method, when a structure such as the semiconductor device is exposed to an observation surface of a thin sample piece, a phenomenon of a line in which an unevenness is formed on the observation surface, a so-called curtaining effect may occur since etching rates of the focused ion beams are different from each other depending on the existence of the structure. For this reason, there has been a problem in that a line is formed on an observation image of the observation surface through an ion beam process in addition to the line caused by a device structure in the related art.

As a solution to this problem, a method has been proposed, in which a sample piece which is cut off from a wafer on a sample stage is rotated by a probe and then fixed to a TEM sample holder on the sample stage (refer to JP-A-2009-110745). According to this method, the sample piece which is fixed to the TEM sample holder can allow a structure to be disposed on the side of a holder and even though the sample piece is irradiated with the ion beam, there is no structure on an incident side, thereby reducing an influence of a curtaining effect.

Meanwhile, an FIB-SEM composite device has been known as a device for observing a cross section, which is etched by irradiating the sample piece with the focused ion beam, by using a scanning electron microscope (SEM). Generally, an SEM observation can be performed with a high resolution when the observation is performed from a direction perpendicular to the observation surface. Thus, a sample processing observation method has been proposed, which performs the SEM observation from a direction perpendicular to a cross section, which is formed through the FIB processing, by using the charged particle beam apparatus in which an FIB column and an SEM column are disposed to be perpendicular to each other (refer to JP-A-2011-196802). According to this method, it is possible to perform the SEM observation for the cross section which is cut off by micromachining by means of the FIB at once with a high resolution.

SUMMARY

However, in a charged particle beam apparatus in which an FIB column and an SEM column are disposed to be perpendicular to each other, there is a problem in that when a sample and a TEM sample holder are disposed on a sample stage, the sample and the TEM sample holder interfere with the columns.

Therefore, illustrative aspects of the present invention provide a charged particle beam apparatus in which an FIB column and an SEM column are disposed to be perpendicular to each other and which is capable of manufacturing a sample piece which reduces the influence of a curtaining effect and a sample observation method.

According to one illustrative aspect of the present invention, there may be provided a charged particle beam apparatus comprising: an electron beam column configured to irradiate a sample with an electron beam; an ion beam column, which is disposed to be substantially perpendicular to the electron beam column, and which is configured to irradiate the sample with the ion beam to perform an etching process; a detector configured to detect a charged particle generated from the sample; an image forming unit configured to form a charged particle image by using detection signals from the detector; a first sample stage, which is configured to hold the sample, and which is movable to be tilted; a second sample stage, which is configured to hold a sample piece cut off from the sample, and which is movable to be tilted; and a probe that is rotatable centering on an axial direction while holding the sample piece.

A tilted axis of the first sample stage may be disposed to be substantially parallel to a tilted axis of the second sample stage.

The probe may be configured to be driven independently from the first sample stage and the second sample stage.

The probe may be disposed closer to the ion beam column rather than the first sample stage.

The detector may be a transmission electron detection unit that is configured to detect the charged particle in a state where the sample is held in the first sample stage and the sample is held in the second sample stage.

According to another illustrative aspect of the present invention, there may be provided a sample observation method comprising the steps of: irradiating a sample with an electron beam; irradiating the sample with the ion beam in a direction substantially perpendicular to the electron beam to perform an etching process; detecting a charged particle generated from the sample; forming a charged particle image by using detection signals from a detector; holding the sample; holding a sample piece cut off from the sample; and rotating centering on an axial direction while holding the sample piece.

According to the charged particle beam apparatus and the sample observation method of the illustrative aspects of the present invention, it is possible to manufacture the sample piece which reduces influence of the curtaining effect.

DETAILED DESCRIPTION

Hereinafter, an illustrative embodiment of a charged particle beam apparatus and a sample observation method according to the present invention will be described.

Figure 1:
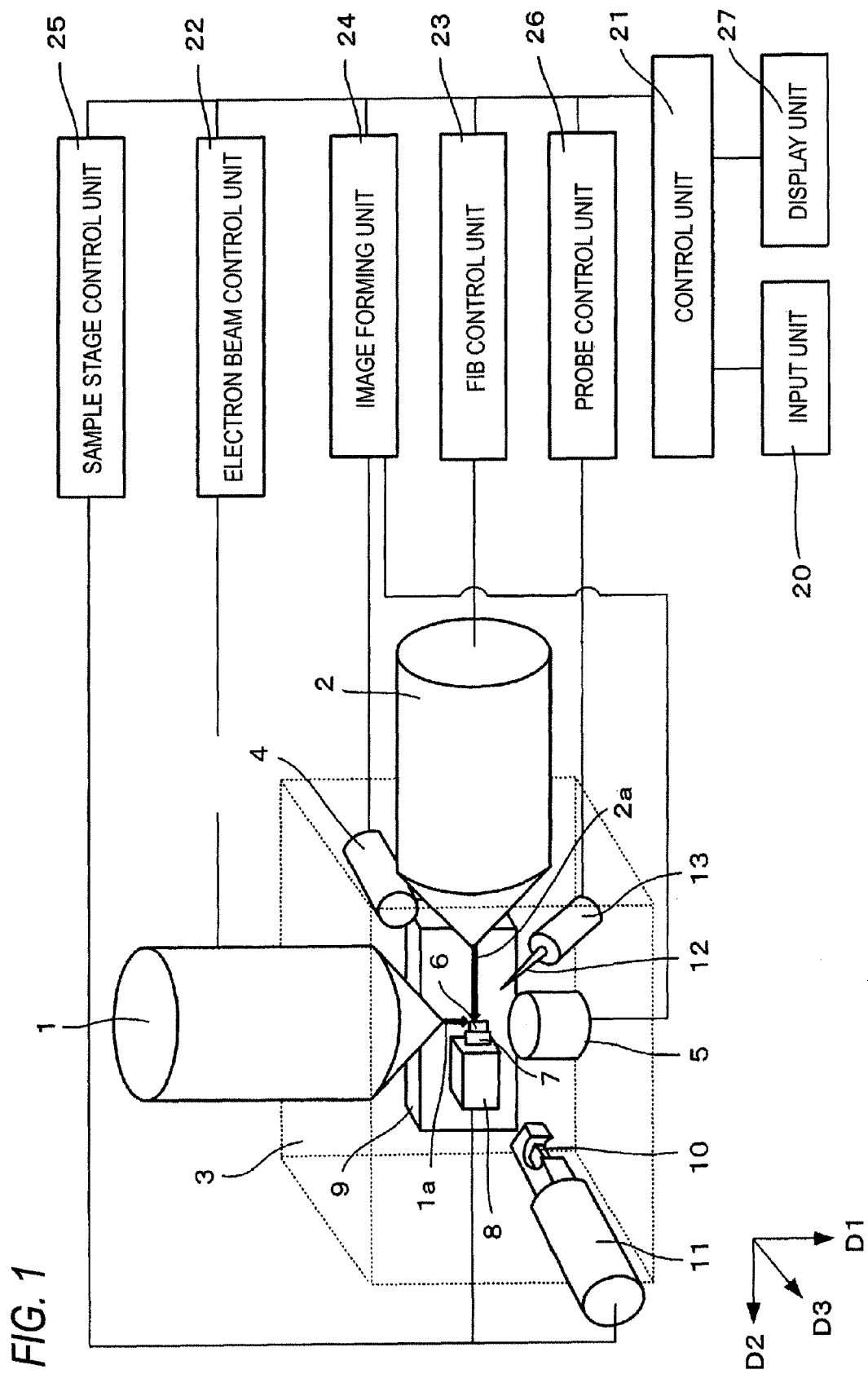
FIG. 1 is a diagram illustrating a configuration of a charged particle beam apparatus and a sample observation method of an illustrative embodiment according to the present invention.

As shown in FIG. 1, the charged particle beam apparatus includes an electron beam column 1 and an FIB (focused ion beam) column 2, and a sample chamber 3. The bulk of sample 6 which is accommodated in the sample chamber 3 is irradiated with an electron beam 1a from the electron beam column 1, and irradiated with an FIB 2a from the FIB column 2. An irradiation axis of the electron beam column 1 and an irradiation axis of the FIB column 2 are disposed to be perpendicular or substantially perpendicular to each other over the sample 6. Even though a tip end of the electron beam column 1 and a tip end of the FIB column 2 are disposed to be close to each other over the sample disposed in the vicinity of an intersection of the above two beams so as to improve performance of a beam, the electron beam column 1 and the FIB column 2 can be disposed without interference.

In addition, the charged particle beam apparatus includes a secondary electron detection unit 4 and a transmission electron detection unit 5 as a charged particle detector. The secondary electron detection unit 4 can detect a secondary electron generated from the sample 6 by being irradiated with the electron beam 1a or the FIB (the ion beam) 2a. The transmission electron detection unit 5 is provided at a position facing the electron beam column 1. The transmission electron detection unit 5 can detect a transmitted electron which is transmitted through a sample piece 6a and the electron beam 1a which is not incident on the sample piece 6a by irradiating the sample piece 6a with electron beam 1a described later.

Further, the charged particle beam apparatus includes a sample holder 7 holding the sample 6. The sample holder 7 is fixed to a first sample stage 8, the first sample stage 8 is fixed to a tilting mechanism 9, and movement of the first sample stage 8 is controlled by a sample stage control unit 25.

The sample stage control unit 25 moves the first sample stage 8 in three axial directions of D1, D2, and D3, and moved to be tilted centering on the direction D3 (rotational movement centering on D3). Incidentally, the moving in the three axial directions of D1, D2 and D3 corresponds to moving in XYZ space including X, Y and Z directions.

In addition, the first sample stage 8 which includes the sample holder 7 fixing the sample 6 cannot have the sample 6 and the TEM sample holder mounted thereon at the same time. The sample holder 7 is disposed at the intersection of the electron beam 1a and the FIB 2a which are substantially perpendicular to each other over the sample 6, and has a size sufficient not to interfere with the electron beam column 1 and the FIB column 2. In the apparatus of the related art in which the electron beam column 1 and the FIB column 2 are disposed by being tilted, it was possible to dispose the wafer (sample 6) of the sample and the TEM sample holder on the same sample stage.

However, in a case where the electron beam column 1 and the FIB column 2 are disposed to be perpendicular or substantially perpendicular to each other as in the present illustrative embodiment, when the sample and the TEM sample holder are disposed on the same sample stage and then tilted, there is a concern that the electron beam column 1 or the FIB column 2 interferes with the sample and the TEM sample holder. Accordingly, in the present illustrative embodiment, the first sample stage 8 and a second sample stage 11 described later corresponding to the TEM sample holder are independently provided.

The sample stage control unit 25 moves the second sample stage 11 at least in direction D3 (possibly moved to directions D1 and D2 in the illustrative embodiment) and moves a TEM sample holder 10 to an irradiated area of the electron beam 1a. In addition, the second sample stage 11 is moved to be tilted centering on the direction D3 as in the case of the first sample stage 8 (rotational movement centering on the direction D3). In this manner, the first sample stage 8 and the second sample stage 11 can be tilted centering on the same axial direction with respect to the sample piece which is fixed to a probe 12 described later and thus it is possible to easily and accurately perform a posture control of the sample piece. Here, the probe 12 is disposed to intersect the irradiation axis of the electron beam of the electron beam column 1 at 30° and the irradiation axis of the FIB of the FIB column 2 at 60° (refer to FIG. 7A).

In addition, the charged particle beam apparatus includes the probe 12 and a probe drive unit 13. The probe 12 is moved at least in three axial directions D1, D2 and D3 and rotatably moved centering on the axial direction.

The probe drive unit 13 is independently moved from the first sample stage 8 and the second sample stage 11. That is, even in a case where the first sample stage 8 or the second sample stage 11 is moved to be tilted, the probe 12 is not moved. For this reason, even though the first sample stage 8 or the second sample stage 11 is moved to be tilted while the sample piece is fixed to the probe 12, the posture of the sample piece is not changed with respect to the electron beam column 1 or the FIB column 2 and thus it is possible to easily and accurately perform the posture control of the sample piece.

The charged particle beam apparatus further includes an electron beam control unit 22, an FIB control unit 23, an image forming unit 24, and a display unit 27. The electron beam control unit 22 transmits an irradiation signal to the electron beam column 1 to irradiate the sample piece 6a with the electron beam 1a from the electron beam column 1. The FIB control unit 23 transmits an irradiation signal to the FIB column 2 to irradiate the sample piece 6a with the FIB 2a from the FIB column 2.

The image forming unit 24 forms a transmission electron image by using a signal causing the electron beam 1a of the electron beam control unit 22 to be scanned and a signal of the transmitted electron detected from the transmission electron detection unit 5. The display unit 27 can display the transmission electron image. In addition, the image forming unit 24 forms data of an SEM image by using the signal causing the electron beam 1a of the electron beam control unit 22 to be scanned and the signal of the secondary electron detected from the secondary electron detection unit 4. The display unit 27 can display the SEM image. Further, the image forming unit 24 forms data of an SIM image by using a signal causing the ion beam 2a of the FIB control unit 23 to be scanned and the signal of the secondary electron detected from the secondary electron detection unit 4. The display unit 27 can display the SIM image.

The charged particle beam apparatus further includes an input unit 20 and a control unit 21. An operator inputs conditions related to a device control to the input unit 20. The input unit 20 transmits input information to the control unit 21. The control unit 21 transmits a control signal to the electron beam control unit 22, the FIB control unit 23, the image forming unit 24, the sample stage control unit 25, or the display unit 27 so as to control an operation of the charged particle beam apparatus. In addition, the control unit 21 transmits the control signal to a probe control unit 26 so as to control the probe 12 as well.

With reference to FIG. 2 to FIG. 5, operations of the first sample stage 8 and the second sample stage 11 will be described.

Figure 2A:
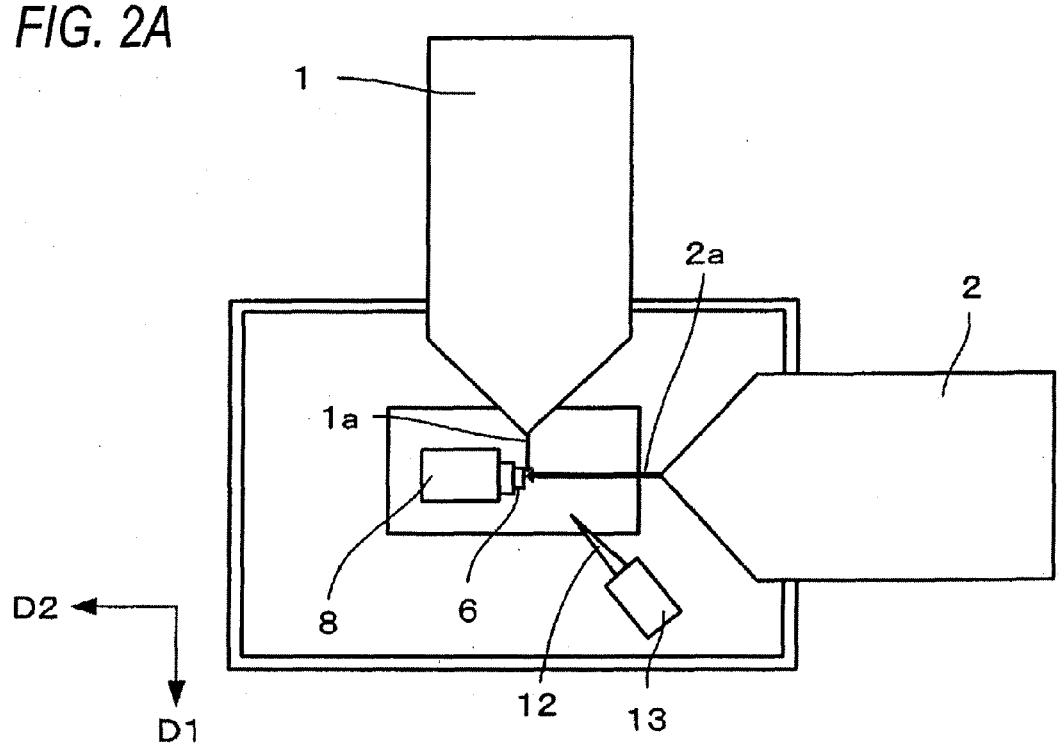
FIGS. 2A and 2B are diagrams illustrating an operation of a first sample stage of the illustrative embodiment according to the present invention.
Figure 2B:
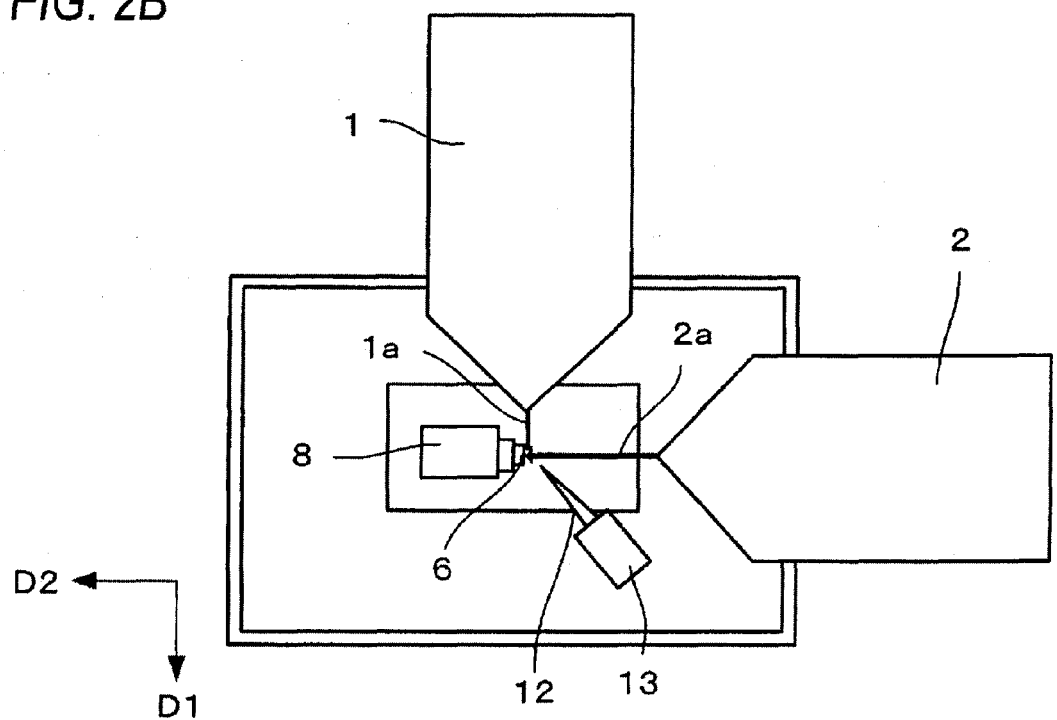

FIG. 2 and FIG. 3 are diagrams illustrating an operation of the first sample stage 8 in the directions D1 and D2. As shown in FIG. 2A, the first sample stage 8 is moved so as to dispose the sample 6 at intersection of the electron beam 1a and FIB 2a. In addition, as shown in FIG. 2B, it is possible to move the probe 12 so as to allow the tip end of the probe 12 to come in contact with the surface of the sample 6. The sample piece 6a which is a portion of the sample 6 is fixed to the tip end of the probe 12 and cut off by means of the FIB 2a.

Figure 3A:
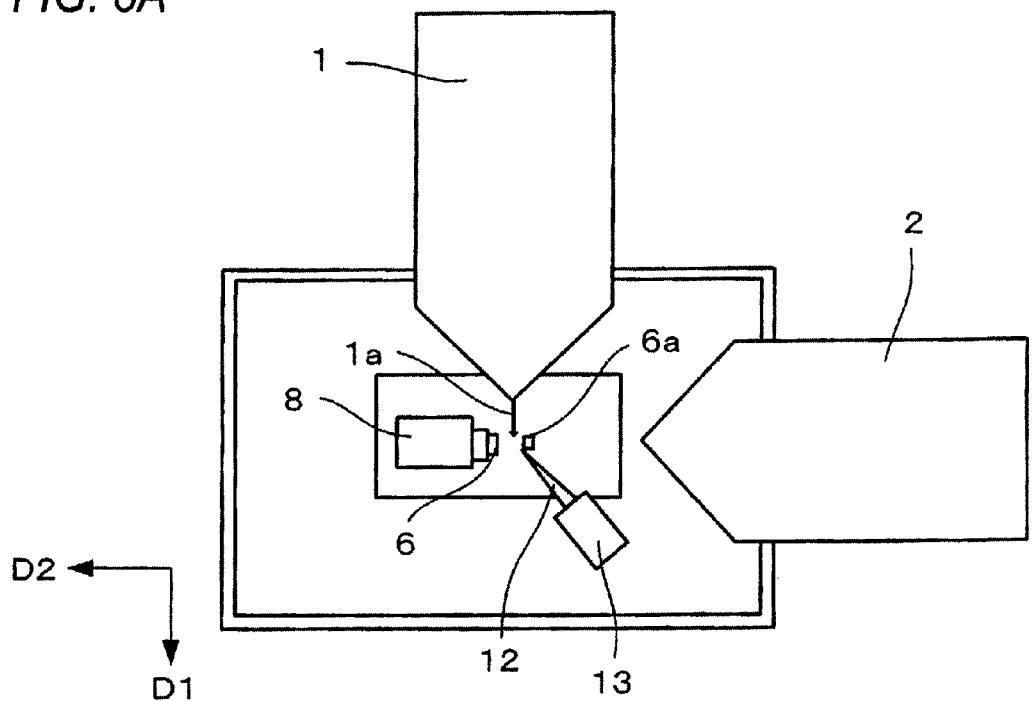
FIGS. 3A and 3B are diagrams illustrating an operation of a first sample stage of the illustrative embodiment according to the present invention.
Figure 3B:
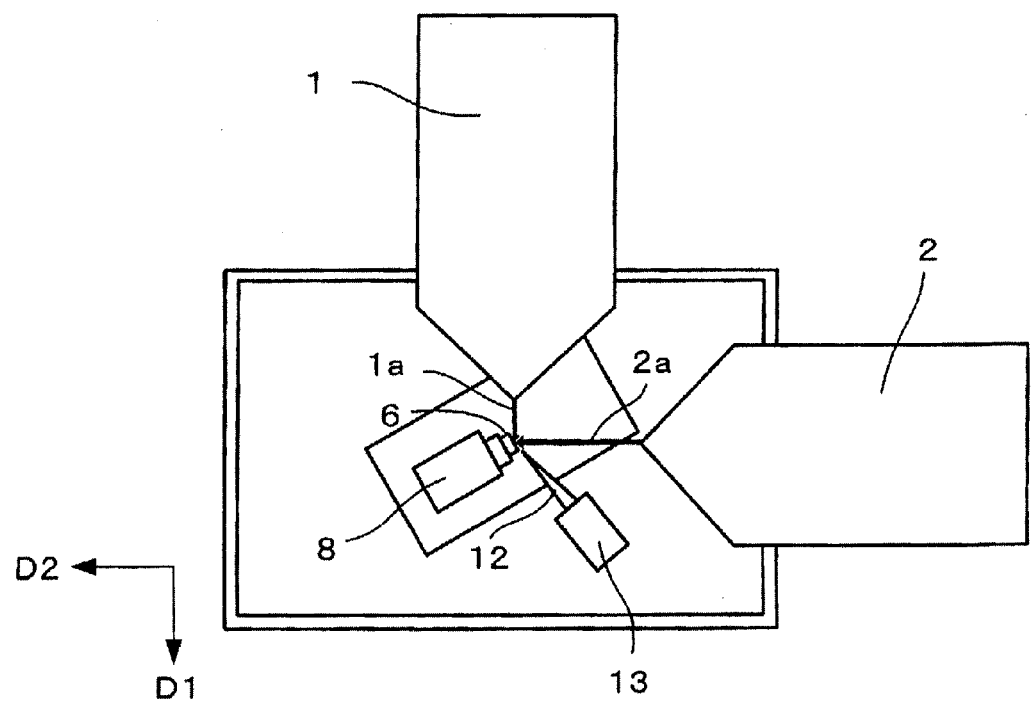

Then, as shown in FIG. 3A, while the sample piece 6a is fixed to the tip end of the probe 12 the first sample stage 8 is retreated in a direction D2. In this manner, the sample piece 6a can be cut off from the sample 6. In addition, as shown in FIG. 3B, before allowing the tip end of the probe 12 to come in contact with the surface of the sample 6, the first sample stage 8 is tilted with respect to the probe 12 and the sample piece 6a is fixed to the tip end of the probe 12 at the same time.

Figure 4A:
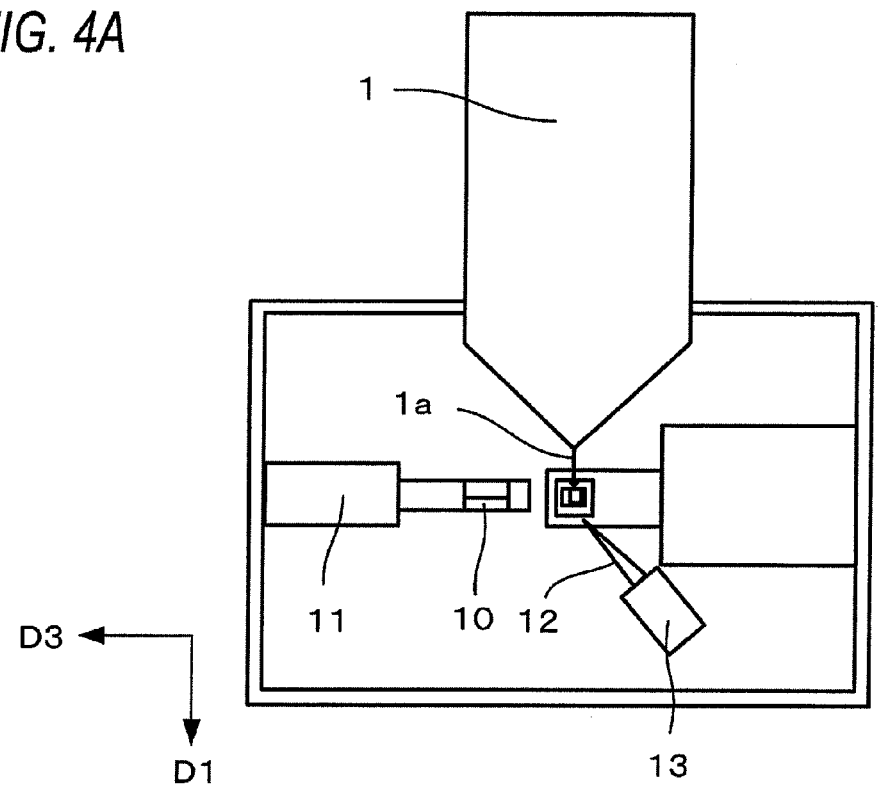
FIGS. 4A and 4B are diagrams illustrating an operation of a second sample stage of the illustrative embodiment according to the present invention.
Figure 4B:
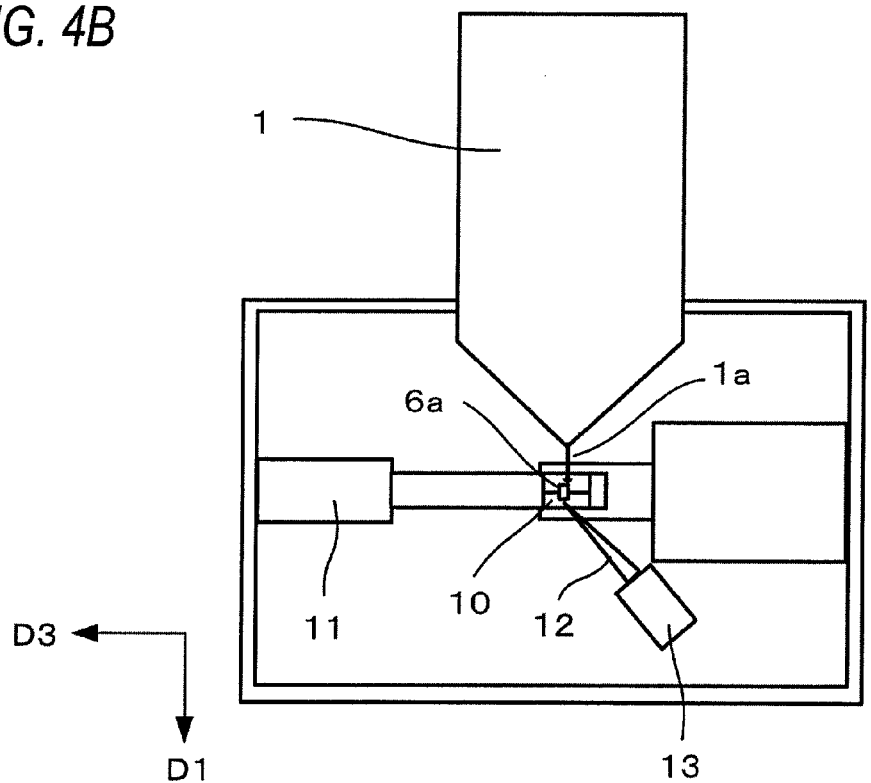
Figure 5:
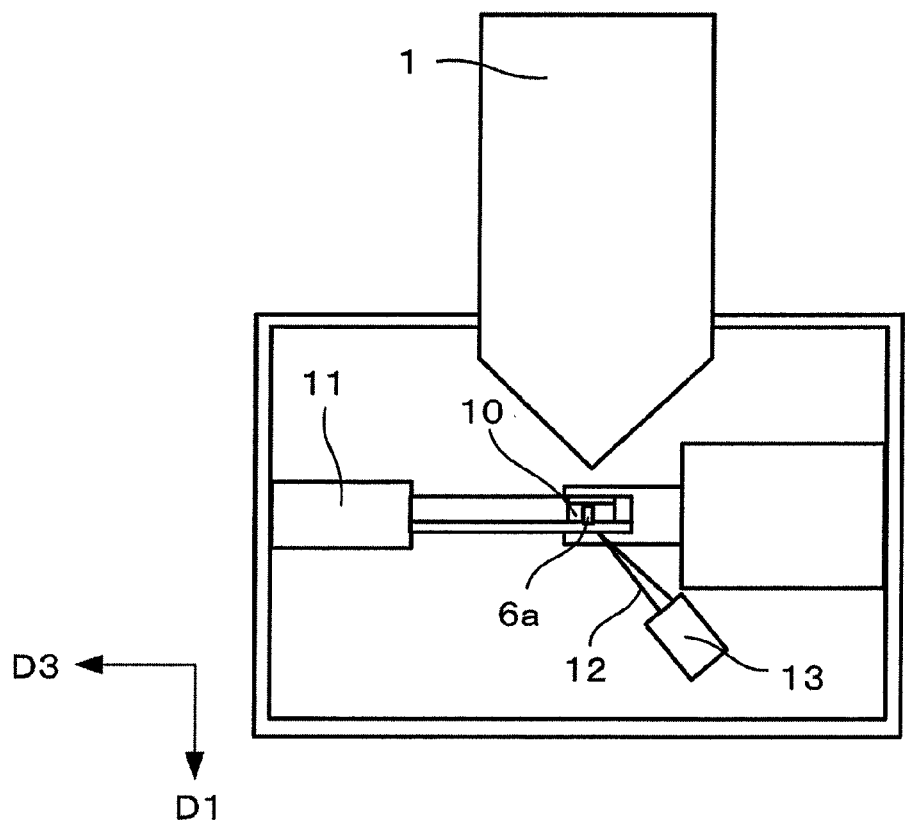
FIG. 5 is a diagram illustrating an operation of a second sample stage of the illustrative embodiment according to the present invention.

FIG. 4 and FIG. 5 are diagrams illustrating an operation of the second sample stage 11 in directions D1 and D3. The second sample stage 11 is, as shown in FIG. 4A, disposed so as to be inserted in the direction substantially perpendicular to the irradiate axis of the electron beam 1a of the electron beam column 1. As shown in FIG. 4B, it is possible to move the second sample stage 11 in a direction opposite to the direction D3 so that the sample piece 6a cut off from the sample 6 is fixed to the tip end of the probe 12 and the TEM sample holder 10 is moved to the irradiated area of the electron beam 1a at the same time. In addition, as shown in FIG. 5, the second sample stage 11 can be independently tilted (rotational movement centering on the direction D3) with respect to the probe 12. In this manner, the sample piece 6a which is fixed to the tip end of the probe 12 is fixed to the TEM sample holder 10.

Figure 6A:
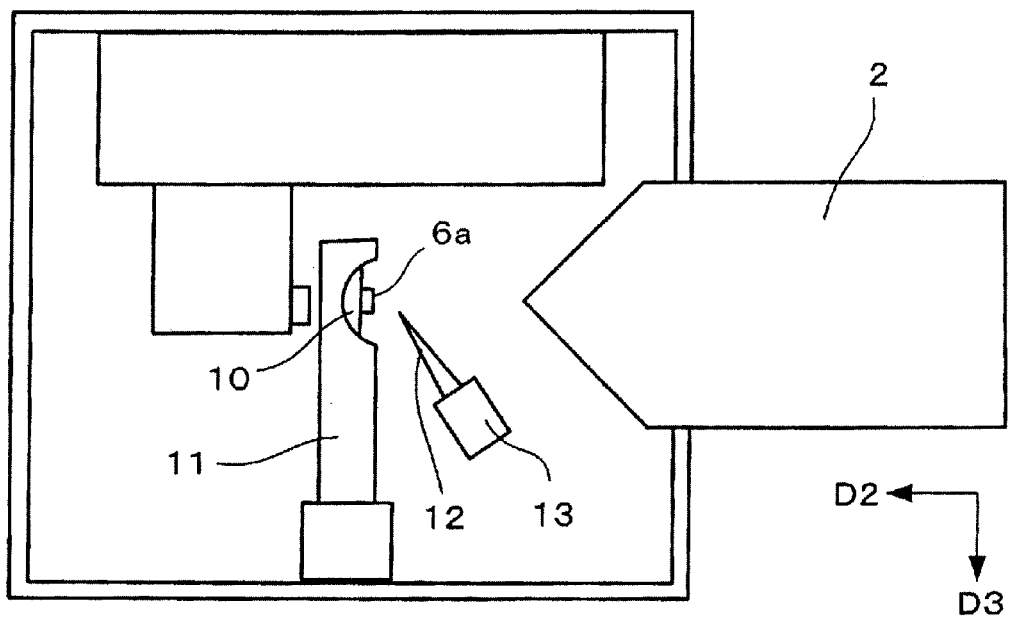
FIG. 6A is a diagram illustrating a second sample stage.

FIG. 6A is a diagram illustrating the second sample stage 11 in the directions D2 and D3. The second sample stage 11 is configured to expose and not shield the irradiation path of the electron beam 1a so that the transmission electron image can be observed by irradiating the sample piece 6a which is fixed to the TEM sample holder 10 with the electron beam 1a and detecting the transmitted electron from the transmission electron detection unit 5.

Figure 6B:
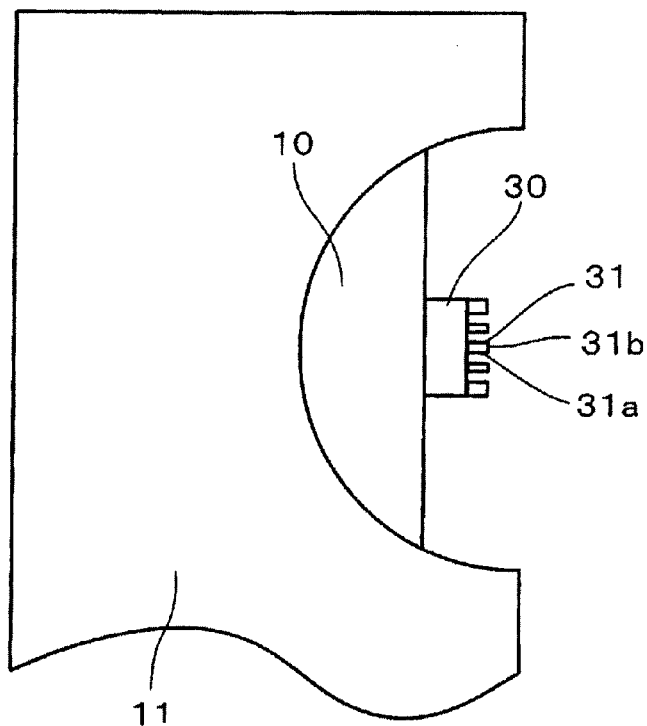
FIG. 6B is a diagram illustrating a TEM sample holder of the illustrative embodiment according to the present invention.

FIG. 6B is a diagram illustrating the TEM sample holder 10. The TEM sample holder 10 includes a holder 30 made of silicon, the holder 30 is provided with a plurality of fixing units 31 and thus the sample piece can be fixed to the respective fixing units. Therefore, it is possible to manage a plurality of the sample pieces. The sample piece 6a is fixed onto a side surface 31a or an upper surface 31b of the fixing unit 31.

Example 1

180°

A posture control method of the sample piece 6a will be described with reference to FIG. 7 to FIG. 9 which illustrate movement of the sample piece 6a. Example 1 illustrates that the sample piece 6a is rotated by 180°.

The sample 6 which is fixed to the tip end of the sample holder 7 on the first sample stage 8 has a device structure like a wiring pattern of a semiconductor and a device structure 6b on the front surface of the sample. When a cross section for a finishing process is irradiated with the FIB from the side of the device structure 6b, the unevenness caused by device structure 6b is formed on the cross section, and thus the so called curtaining effect may occur. Therefore, it is not possible to perform accurate analysis of the sample. Thus, a cross section of the sample piece 6a which reduces the influence of the curtaining effect is formed by the present invention.

Figure 7A:
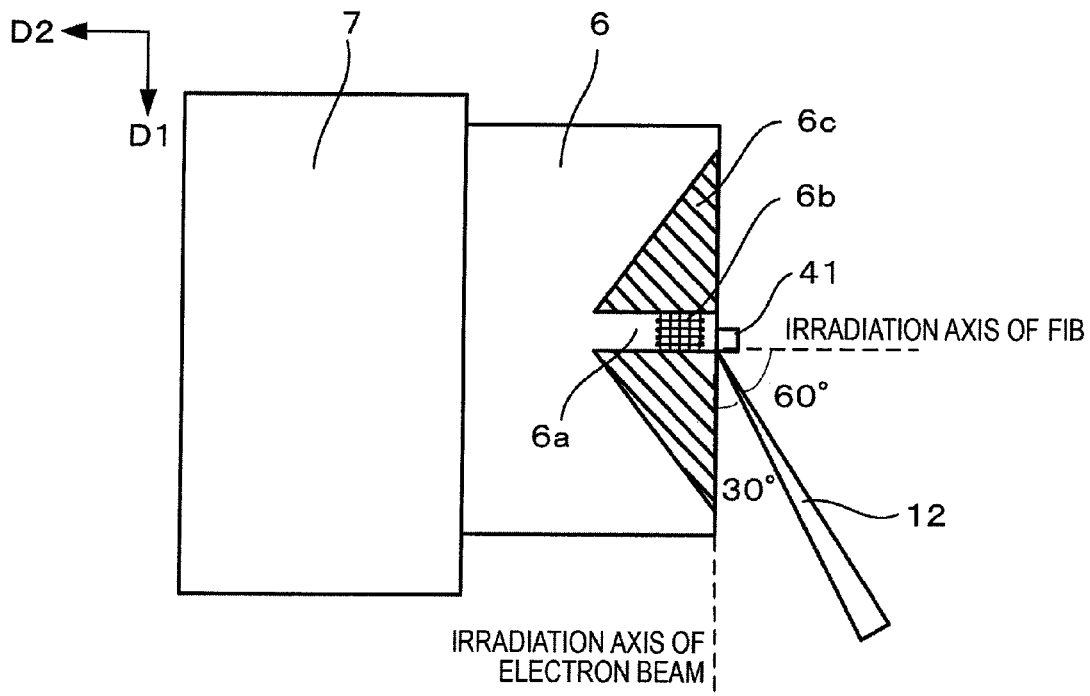
FIGS. 7A and 7B are diagrams illustrating movement of a sample piece which illustrates an example of Example 1 of the illustrative embodiment according to the present invention.

As shown in FIG. 7A, in order to cut off the sample piece 6a which contains a portion serving as a target of the TEM observation, the sample 6 is irradiated with the FIB 2a and a processing groove 6c is formed by an etching process. Then, the sample piece 6a is fixed to the tip end of the probe 12 by allowing the tip end of the probe 12 to come in contact with the sample piece 6a, being irradiated with the FIB 2a or the electron beam 1a while supplying a deposition gas, and forming a deposition film 41 (for fixing the probe and a sample piece).

Figure 7B:
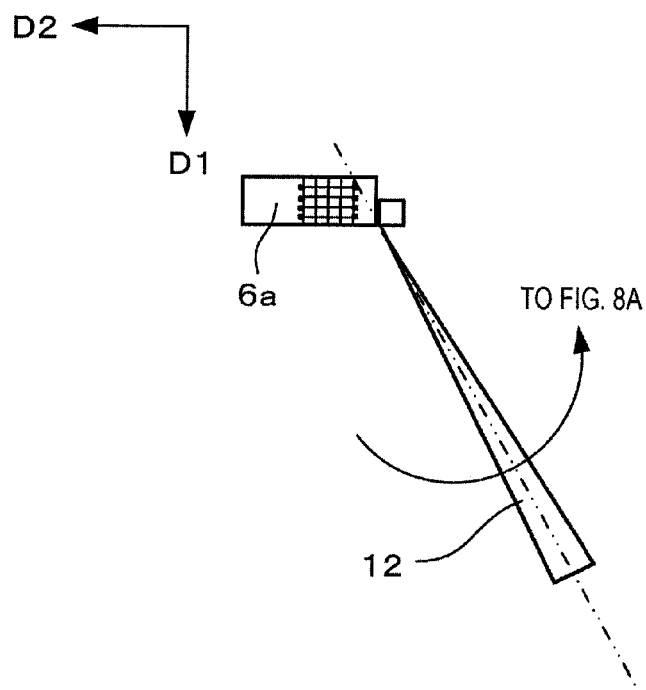
Figure 8A:
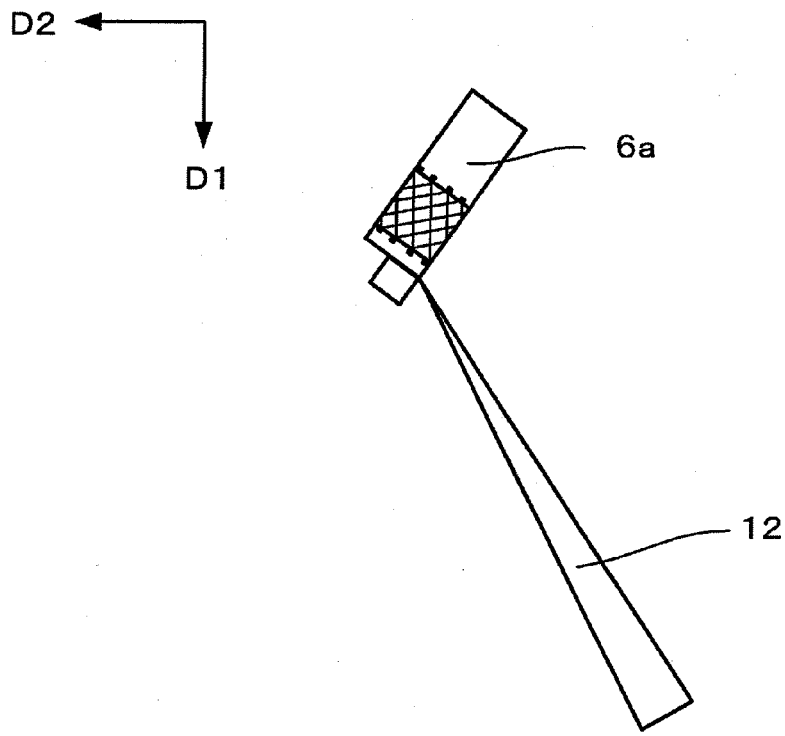
FIGS. 8A and 8B are diagrams illustrating the movement of the sample piece of Example 1, continued from FIG. 7B.

Next, the first sample stage 8 is retreated in the direction D2. At this moment, the sample piece 6a is, as shown in FIG. 7B, in a state of being fixed to the probe 12, and the sample piece 6a is cut off from the sample 6. In addition, the probe 12 is rotated by 180° (refer to a curved arrow in FIG. 7B). As such, the posture of the sample piece 6a is changed as shown in FIG. 8A. In other words, the sample piece 6a is tilted by 120° with respect to the irradiation axis of the electron beam (refer to FIG. 7A). Next, the second sample stage 11 is moved and the TEM sample holder 10 is moved to the irradiated area of the electron beam 1a. Further, the second sample stage 11 is tilted by 60° with respect to the irradiation axis of the FIB.

Figure 8B:
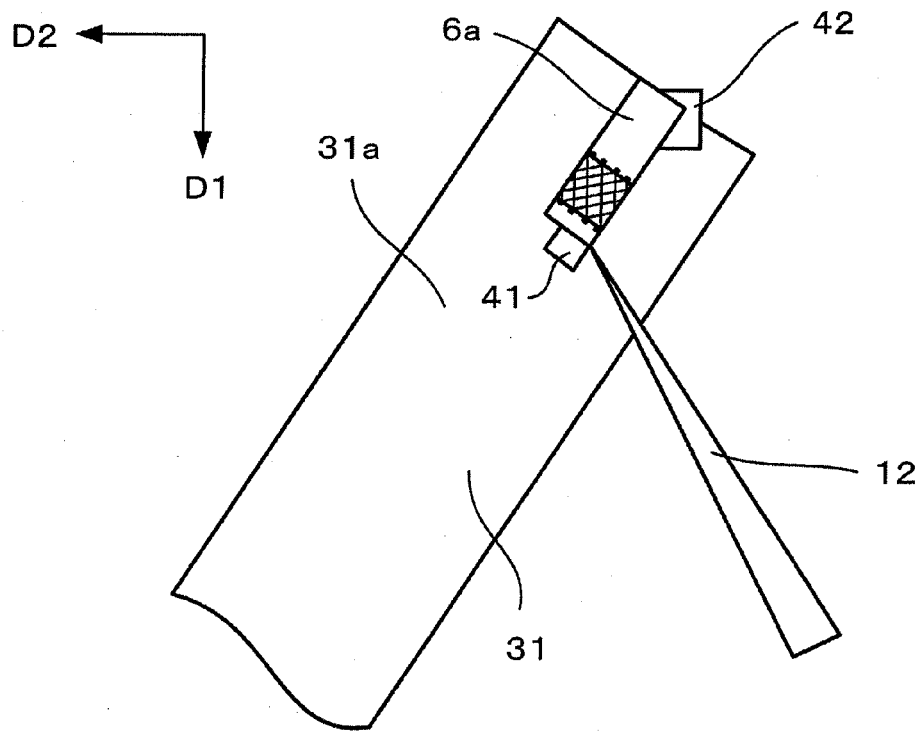

As such, the fixing unit 31 of the TEM sample holder 10 and the sample piece 6a are substantially parallel to each other as shown in FIG. 8B. Thereafter, the sample piece 6a is fixed to the tip end of the side surface 31a of the fixing unit 31 by allowing the side surface 31a to come in contact with the sample piece 6a, being irradiated with FIB 2a or the electron beam 1a while supplying the deposition gas, and forming other deposition film 42 (for fixing the fixing unit and the sample piece).

Figure 9A:
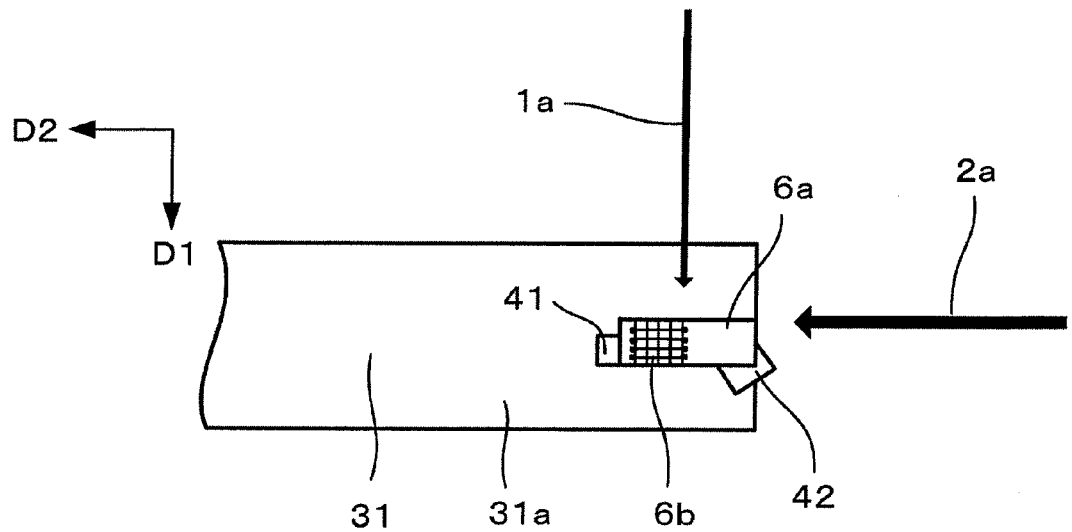
FIGS. 9A and 9B are diagrams illustrating the movement of the sample piece of Example 1, continued from FIG. 8B.

Thus, as shown in FIG. 9A, the tilt of the second sample stage 11 is returned and a finishing process for the cross section of the sample piece 6a is performed by means of the FIB 2a. Since the device structure 6b is disposed on the side opposite to the side which is irradiated with the beam so that the sample piece 6a is rotated by 180° from the state in FIG. 7 to be fixed to the fixing unit 31, in this state, it is possible to suppress the curtaining effect by performing the finishing process by means of the FIB 2a. In addition, the sample piece 6a which is fixed to the TEM sample holder 10 is irradiated with the electron beam 1a, the transmitted electron is detected from the transmission electron detection unit 5, and thus it is possible to observe the transmission electron image. In this manner, it is possible to confirm a state of the finishing process for the sample piece 6a.

Figure 9B:
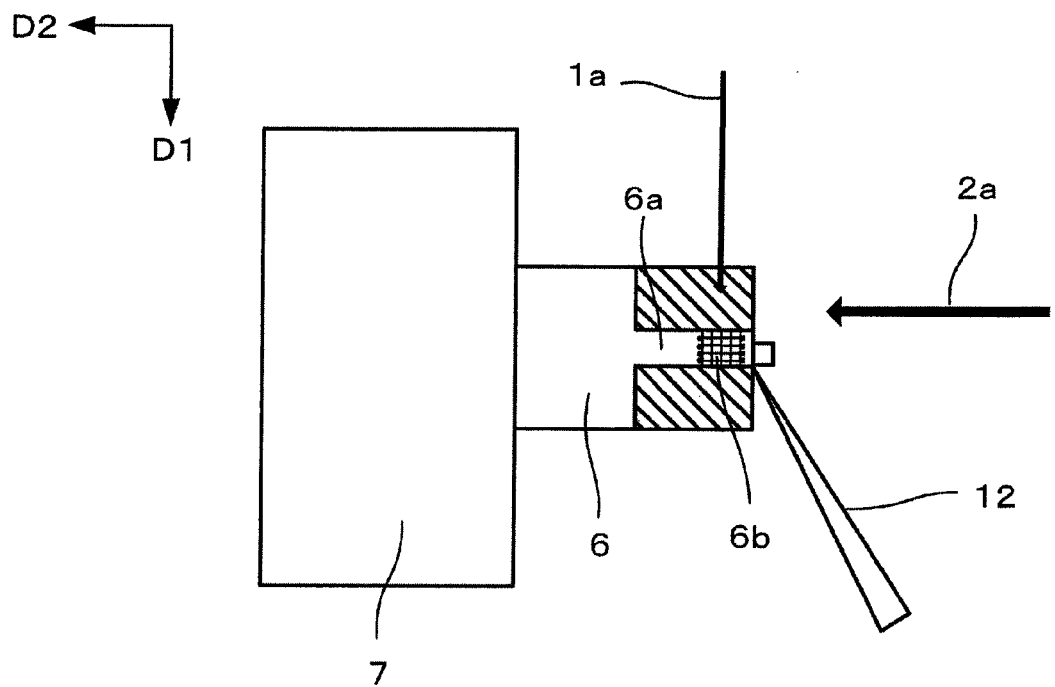

Here, when processing the sample 6, as shown in FIG. 9B, it is possible to obtain the transmission electron image of the sample piece 6a before and after the posture control if the sample piece 6a is irradiated with the electron beam 1a and then the processing groove is formed by means of the FIB 2a so that the transmitted electron can be detected. In this manner, it is possible to more accurately manufacture the sample piece which contains a predetermined target.

In the present example, in a state of FIG. 7A to FIG. 8B, the device structure 6b is moved by 180° with respect to the FIB 2a so that a surface on which the device structure 6b is not formed, instead of a surface on which the device structure 6b is formed, faces the FIB 2a. Accordingly, it is possible to manufacture the sample piece 6a which reduces the influence of the curtaining effect.

Example 2

180°

With reference to FIG. 10 to FIG. 11, Example 2 in which the sample piece 6a is rotated by 180° will be described. Example 2 is different from Example 1 in that the first sample stage 8 is tilted by 20° with respect to the irradiation axis of the FIG and the sample 6 which is fixed to the tip end of the sample holder 7 of the first sample stage 8 is also tilted by 20°.

Figure 10A:
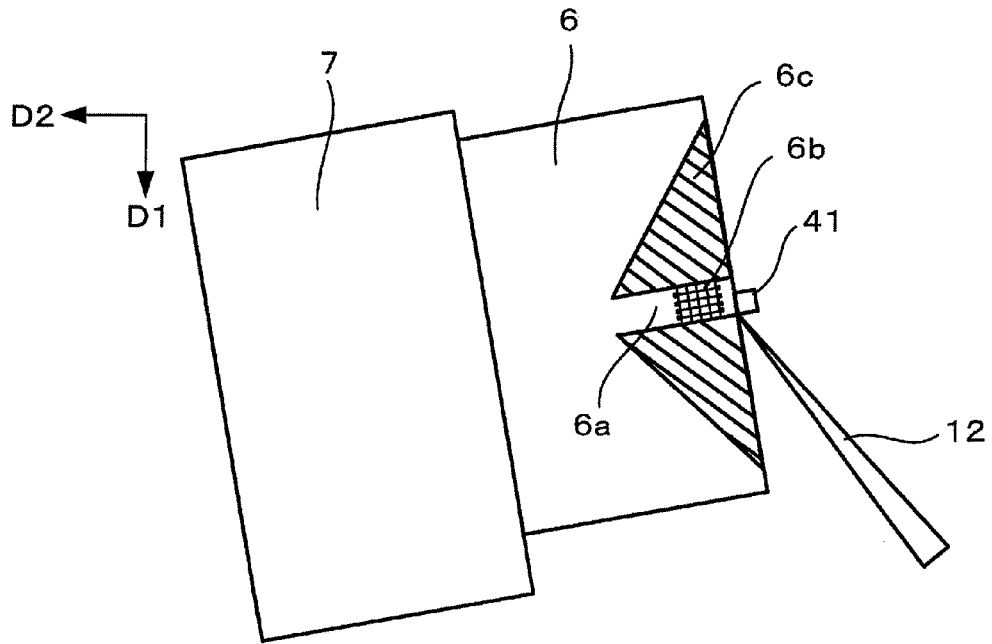
FIGS. 10A and 10B are diagrams illustrating movement of a sample piece which illustrates an example of Example 2 of the illustrative embodiment according to the present invention.

As shown in FIG. 10A, in order to cut off the sample piece 6a which contains a portion serving as the target of the TEM observation, the sample 6 is irradiated with the FIB 2a and the processing groove 6c is formed by an etching process. Then, the sample piece 6a is fixed to the tip end of the probe 12 by allowing the tip end of the probe 12 to come in contact with the sample piece 6a, being irradiated with the FIB 2a or the electron beam 1a while supplying a deposition gas, and forming the deposition film 41.

Figure 10B:
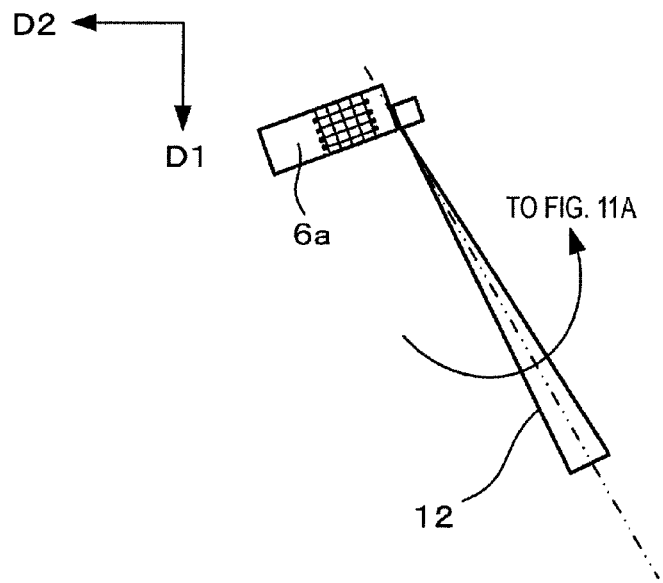
Figure 11A:
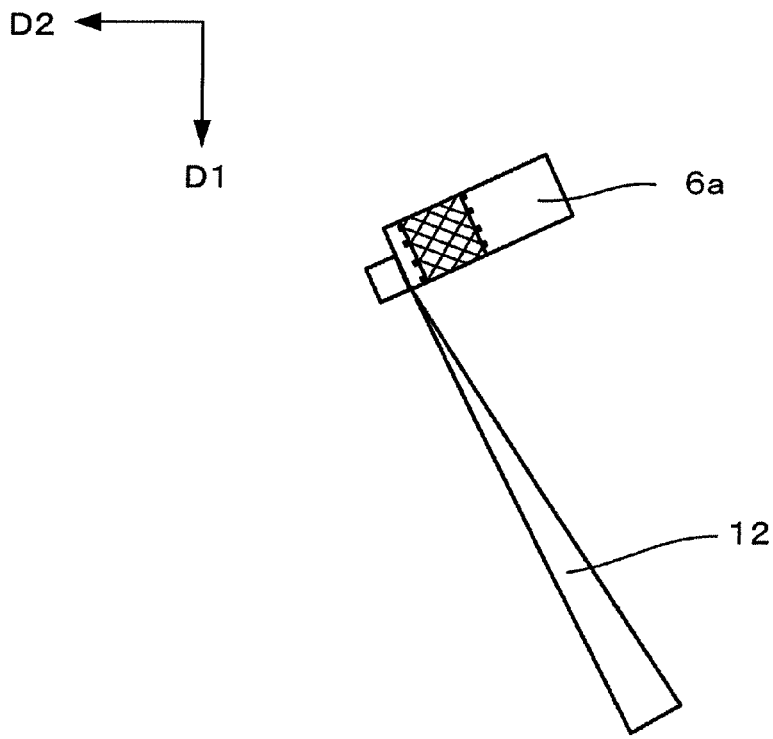
FIGS. 11A and 11B are diagrams illustrating the movement of the sample piece of Example 2, continued from FIG. 10B.

Next, the first sample stage 8 is retreated in the direction D2. At this moment, the sample piece 6a is, as shown in FIG. 10B, in a state of being fixed to the probe 12. In addition, the probe 12 is rotated by 180° (refer to a curved arrow in FIG. 10B). As such, the posture of the sample piece 6a is changed as shown in FIG. 11A. In other words, the sample piece 6a is tilted by 130° with respect to the irradiation axis of the electron beam. Next, the second sample stage 11 is moved and the TEM sample holder 10 is moved to the irradiated area of the electron beam 1a. Further, the second sample stage 11 is tilted by 40° with respect to the irradiation axis of the FIB.

Figure 11B:
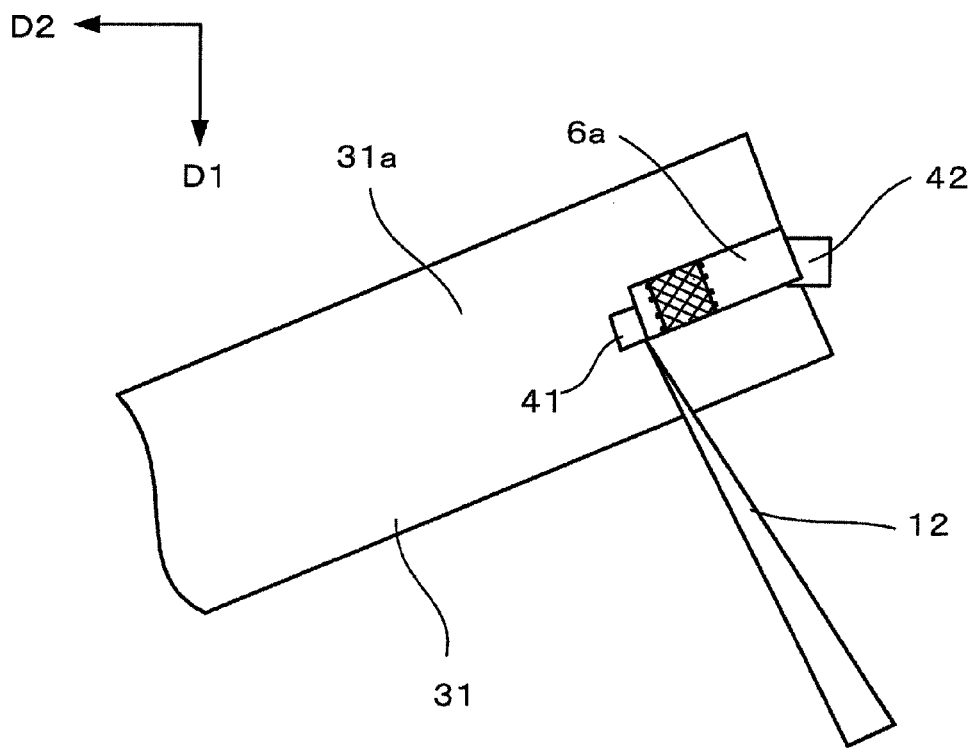

As such, the fixing unit 31 of the TEM sample holder 10 and the sample piece 6a are substantially parallel to each other as shown in FIG. 11B. Thereafter, the sample piece 6a is fixed to the tip end of the side surface 31a of the fixing unit 31 by allowing the side surface 31a to come in contact with the sample piece 6a, being irradiated with the FIB 2a or the electron beam 1a while supplying the deposition gas, and forming said other deposition film 42.

Example 3

90°

With reference to FIG. 12 to FIG. 16, Example 3 in which the sample piece 6a is rotated by 90° will be described.

Figure 12A:
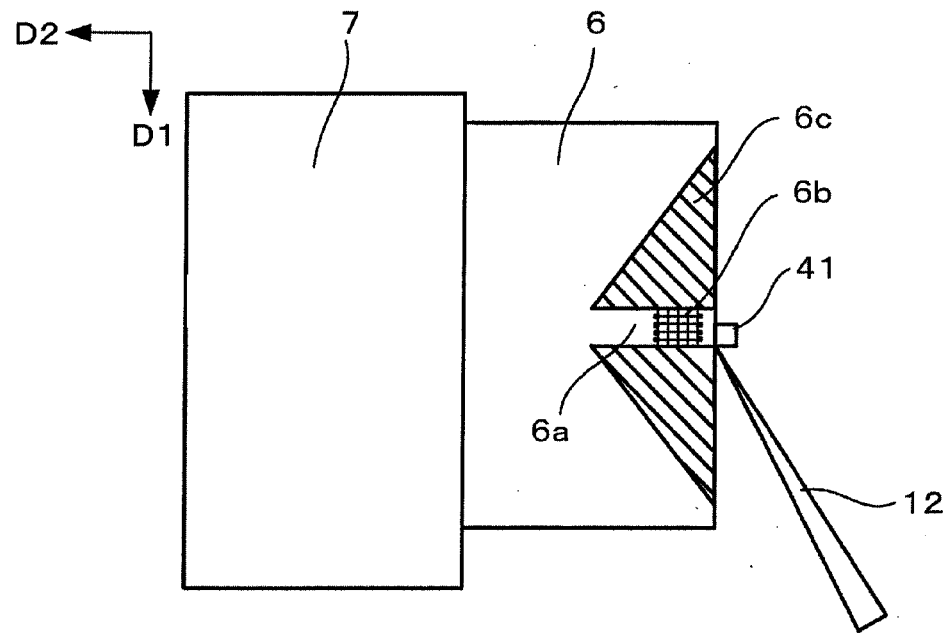
FIGS. 12A and 12B are diagrams illustrating movement of a sample piece which illustrates an example of Example 3 of the illustrative embodiment according to the present invention.
Figure 12B:
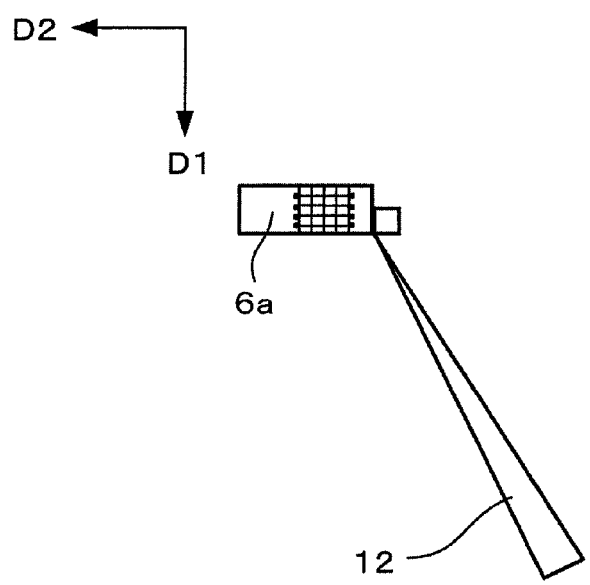
Figure 13A:
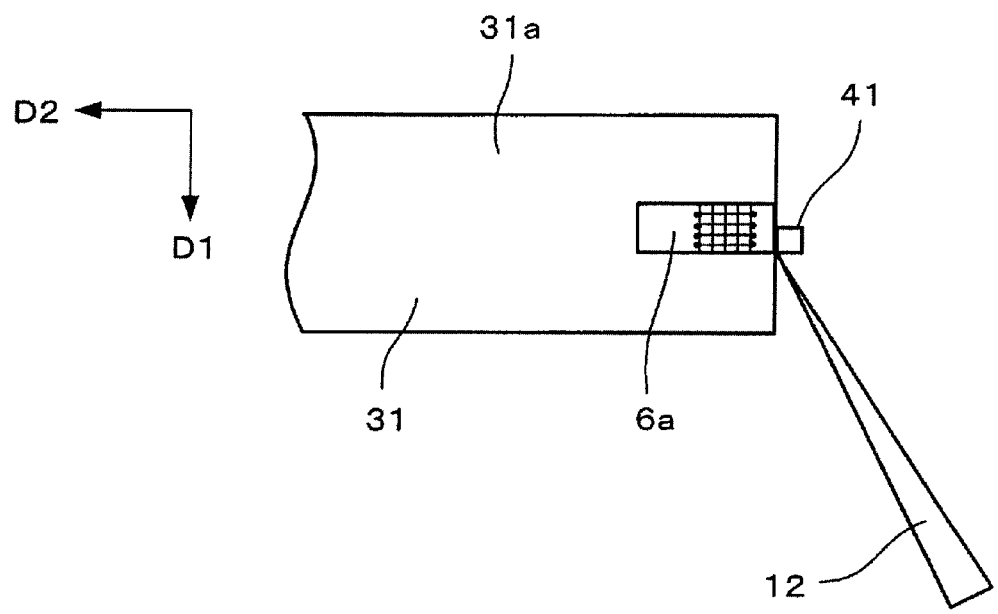
FIGS. 13A and 13B are diagrams illustrating the movement of the sample piece of Example 3, continued from FIG. 12B, FIGS. 14A and 14B are diagrams illustrating the movement of the sample piece of Example 3, continued from FIG. 13B.
Figure 13B:
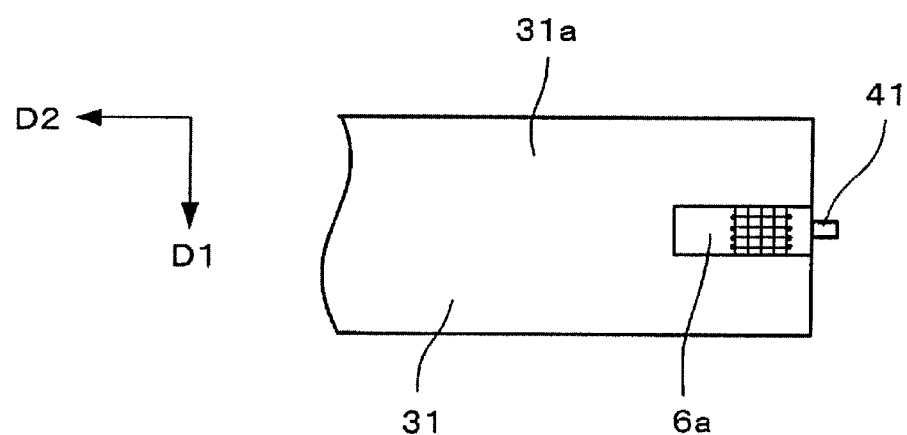

As shown in FIG. 12, a method of cutting off the sample piece 6a which contains a portion serving as the target of the TEM observation and then fixing to the probe 12 is the same as in Examples 1 and 2. Then, as shown in FIG. 13A, the fixing unit 31 of the TEM sample holder 10 and the sample piece 6a are substantially parallel to each other. Thereafter, the sample piece 6a is fixed to the tip end of the side surface 31a of the fixing unit 31 by allowing the side surface 31a to come in contact with the sample piece 6a, being irradiated with the FIB 2a or the electron beam 1a while supplying the deposition gas, and forming a deposition film (not shown) between the side surface 31a and the sample piece 6a. Then, after removing a part of the deposition film 41 by being irradiated with the electron beam 1a or the FIB 2a, the probe 12 is retreated (refer to FIG. 13B).

Figure 14A:
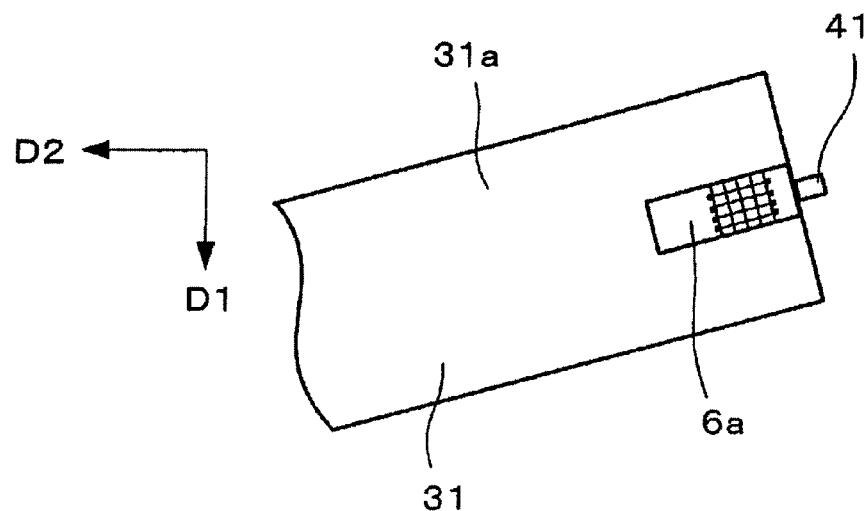
Figure 14B:
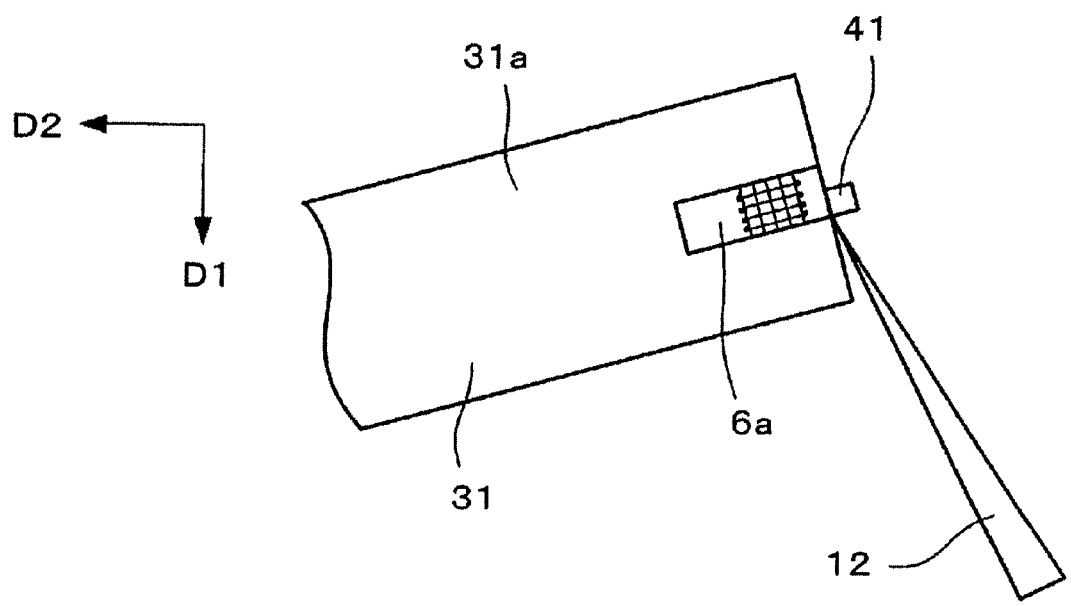
Figure 15A:
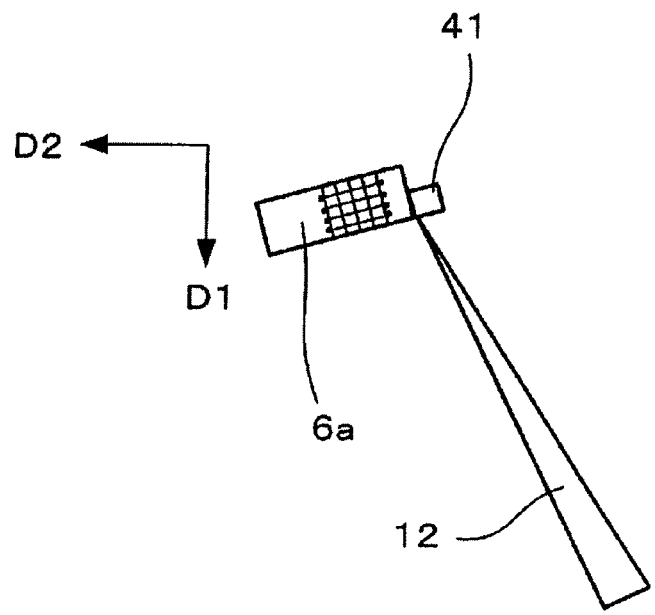
FIGS. 15A and 15B are diagrams illustrating the movement of the sample piece of Example 3, continued from FIG. 14B.
Figure 15B:
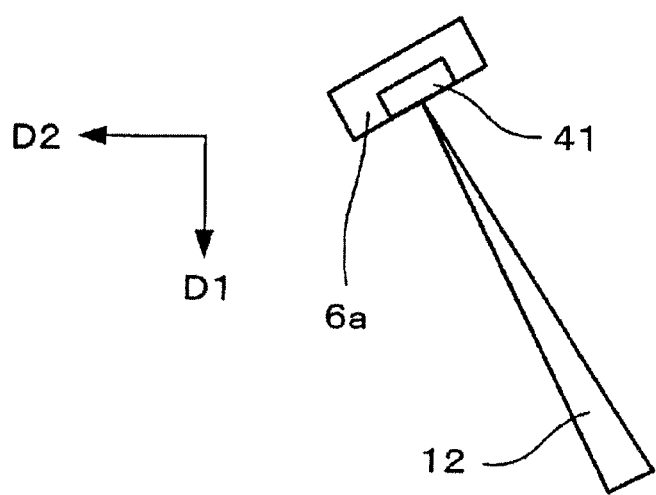
Figure 16:
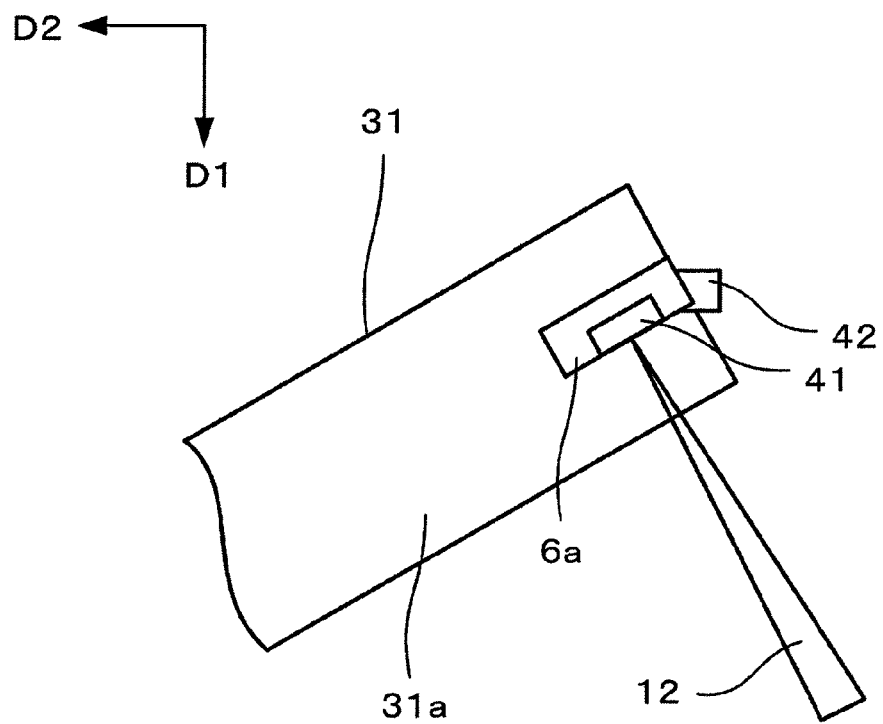
FIG. 16 is a diagram illustrating the movement of the sample piece of Example 3, continued from FIG. 15.

Further more, as shown in FIG. 14A, if the second sample stage 11 is tilted by 30°, the fixing unit 31 of the TEM sample holder 10 and the sample piece 6a are tilted by 30° at the same time. Then, forming the deposition film 41 again and the sample piece 6a is fixed to the probe 12 again (refer to FIG. 14B). Next, as shown in FIG. 15A, the sample piece 6a is cut off from the fixing unit 31 so that the probe 12 is rotated by 90° in a direction opposite to the curved arrow shown in FIG. 7B or FIG. 10B, as shown in FIGS. 15A and 15B. Then, as shown in FIG. 16, the second sample stage 11 is tilted by 30° and said other deposition film 42 is formed, so as to fix the sample piece 6a. The fixing unit 31 of the TEM sample holder 10 is tilted by 30°, and thus the sample piece 6a is also tilted by 30°.

Example 4

Planar TEM Sample

With reference to FIG. 17 and FIG. 18, an example of manufacturing a flat TEM sample will be described.

Figure 17A:
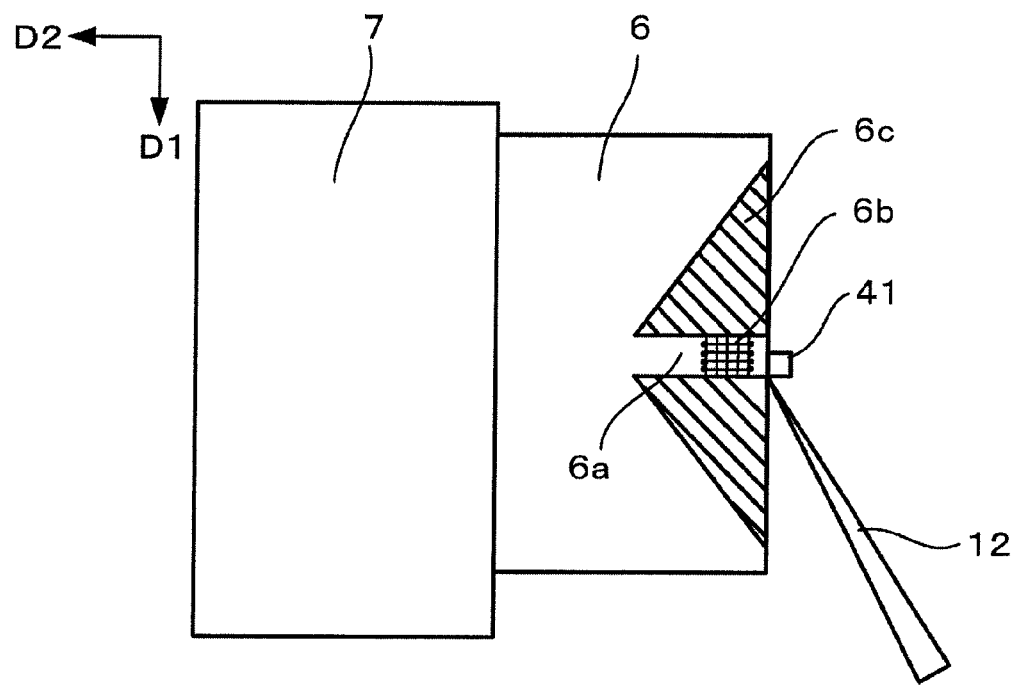
FIGS. 17A and 17B are diagrams illustrating an example of manufacturing a planar TEM sample of Example 4 of the illustrative embodiment according to the present invention.
Figure 17B:
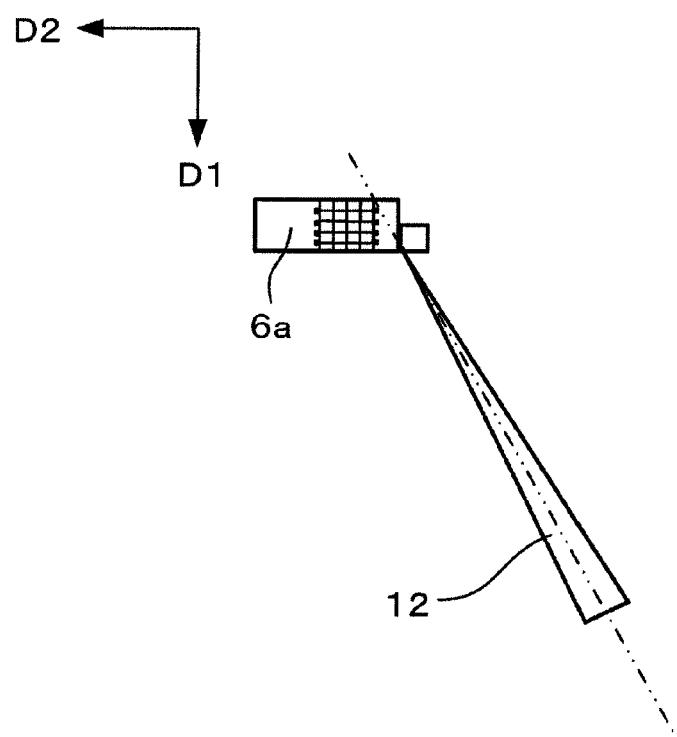
Figure 18A:
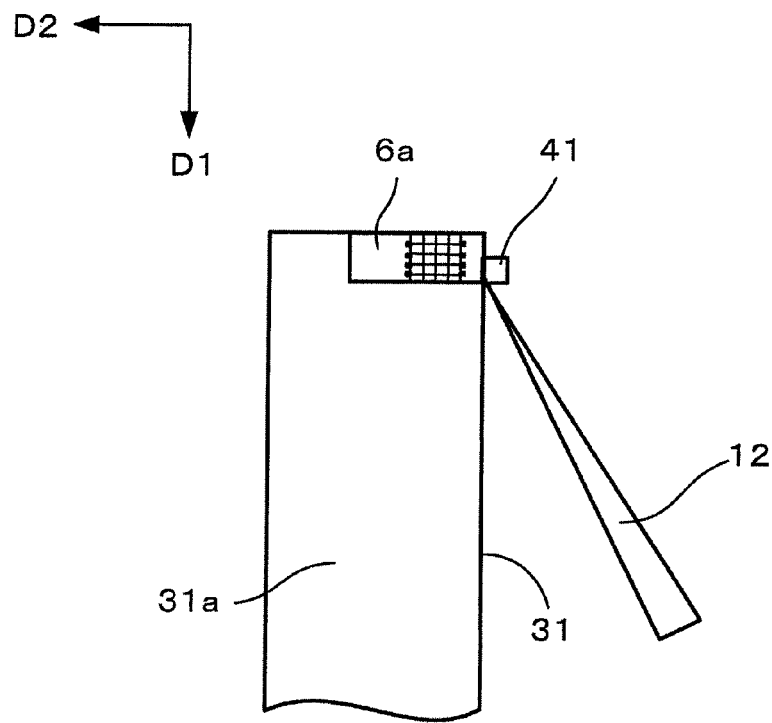
FIGS. 18A and 18B are diagrams illustrating movement of Example 4, continued from FIG. 17B.
Figure 18B:
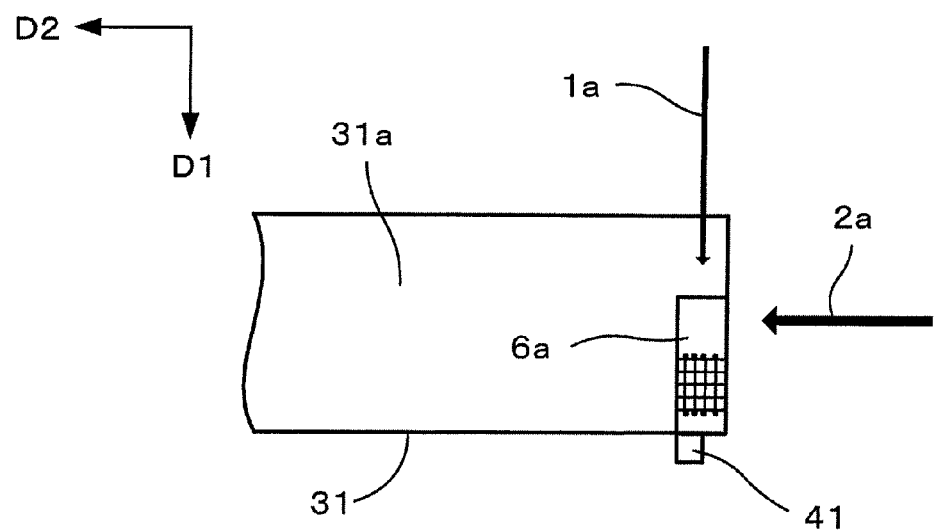

As shown in FIGS. 17A and 17B, a method of cutting off the sample piece 6a which contains a portion serving as the target of the TEM observation and fixing the sample piece 6a to the probe 12 is the same as in Examples 1 and 2. Then, as shown in FIG. 18A, the sample piece 6a is fixed onto the side surface 31a of the fixing unit 31 of the TEM sample holder 10 in a state where the fixing unit 31 is tilted by 0°. Then, the second sample stage 11 and the fixing unit 31 of the TEM sample holder 10 is rotated by 90° in the direction D2. In this manner, as shown in FIG. 18B, the electron beam 1a is incident on the surface of the sample piece 6a in a direction to a normal line, and thus it is possible to manufacture the planar TEM sample which is used to perform the TEM observation.

Example 5

Flat TEM Sample

With reference to FIG. 19 to FIG. 22, another example of manufacturing a flat TEM sample will be described. Example 5 is different from Example 4 in that the fixing unit 31 of the second sample stage 11 and the TEM sample holder 10 and the sample piece 6a are tilted by 10° with respect to the irradiation axis of the FIB.

Figure 19A:
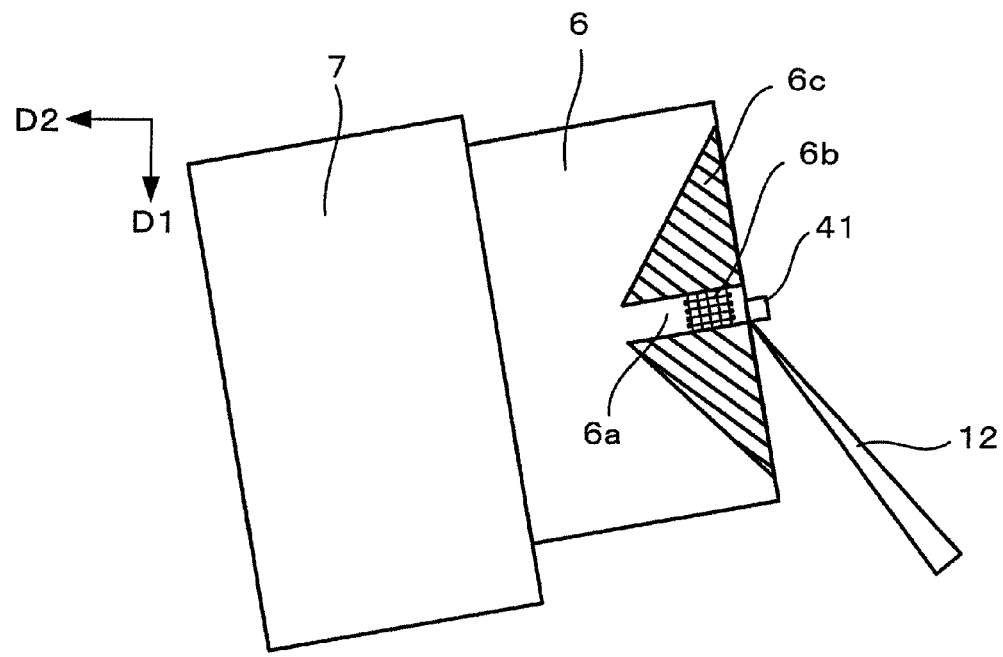
FIGS. 19A and 19B are diagrams illustrating an example of manufacturing a planar TEM sample of Example 5 of the illustrative embodiment according to the present invention.
Figure 19B:
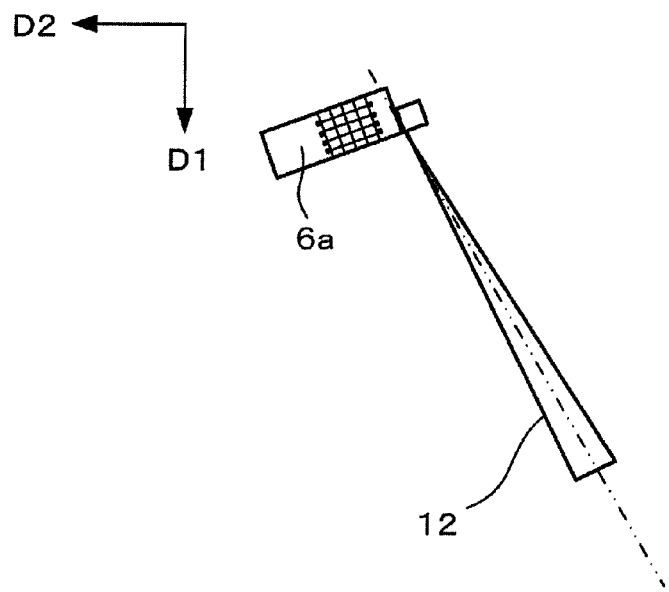
Figure 20A:
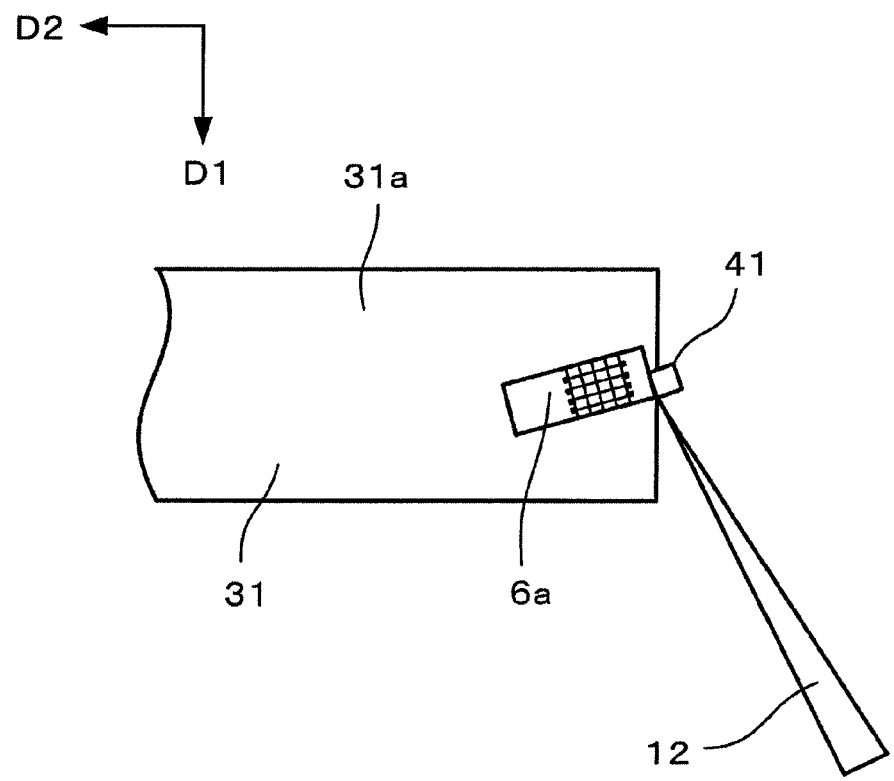
FIGS. 20A and 20B are diagrams illustrating movement of the sample piece of Example 5, continued from FIG. 19B.
Figure 20B:
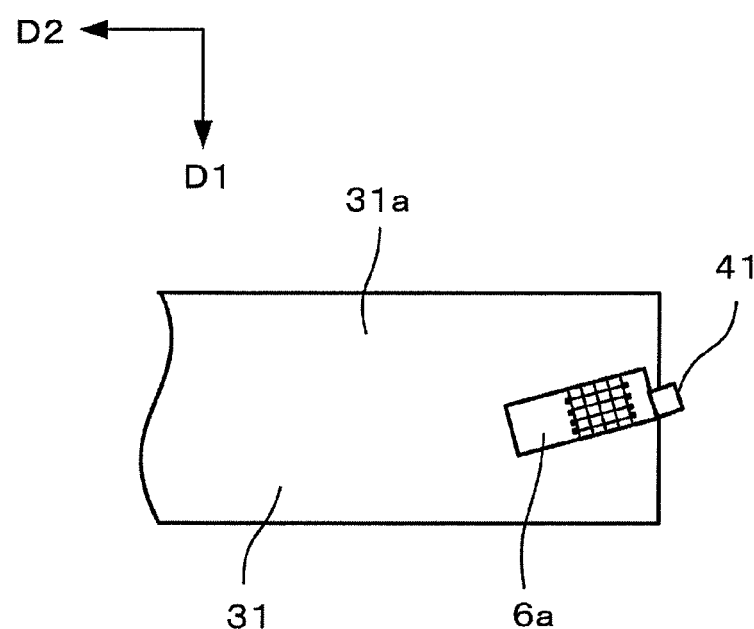

As shown in FIGS. 19A and 19B, a method of cutting off the sample piece 6a which contains a portion serving as the target of the TEM observation and then fixing to the probe 12 is the same as in Examples 1 and 2. As shown in FIG. 20A, the sample piece 6a is temporarily fixed to the fixing unit 31 of the second sample stage 11 and the TEM sample holder 10 (tilt 0°) so as to retreat the probe 12 (refer to FIG. 20B).

Figure 21A:
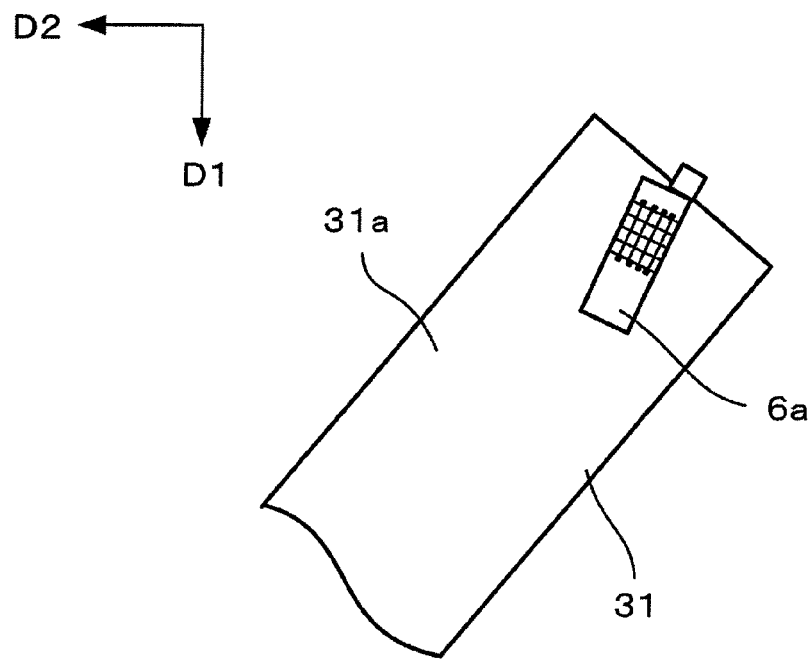
FIGS. 21A and 21B are diagrams illustrating the movement of the sample piece of Example 5, continued from FIG. 20B.
Figure 21B:
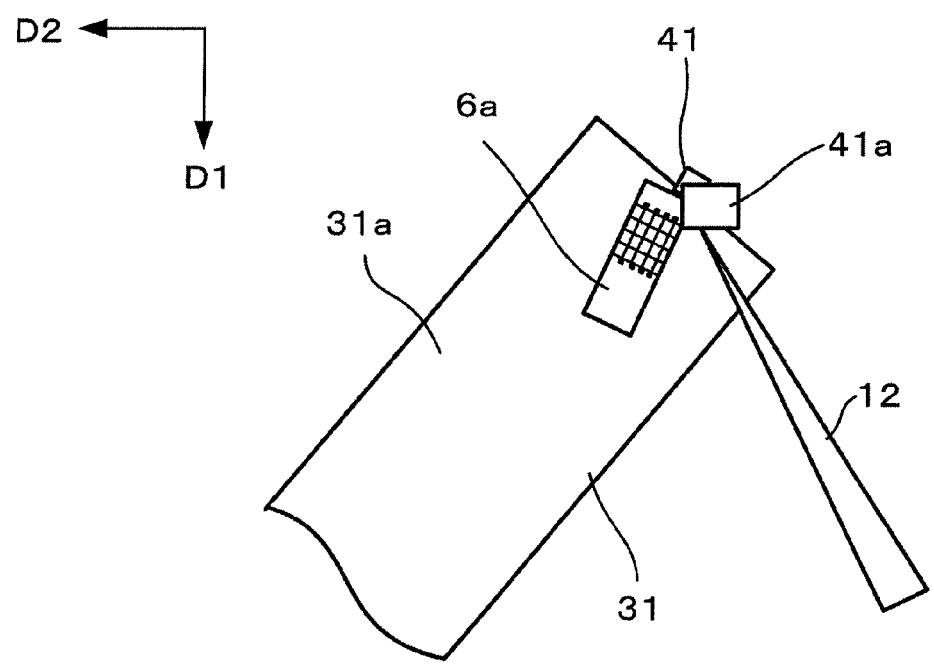
Figure 22A:
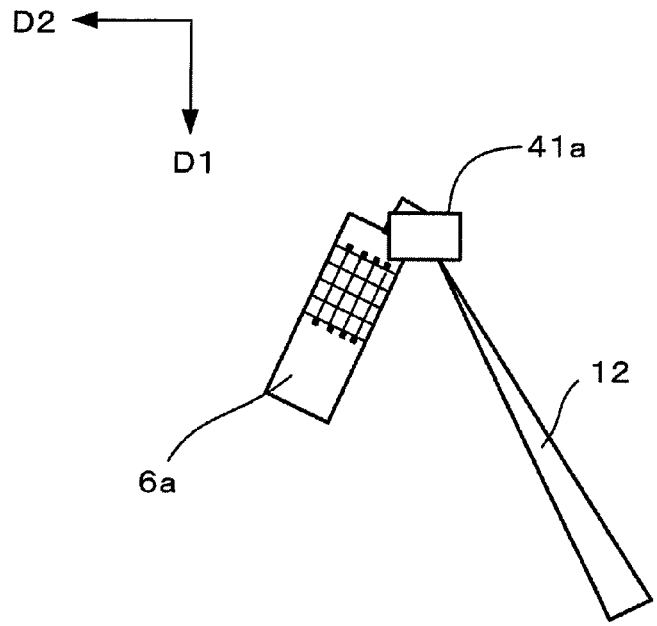
FIGS. 22A and 22B are diagrams illustrating the movement of the sample piece of Example 5, continued from FIG. 21B.
Figure 22B:
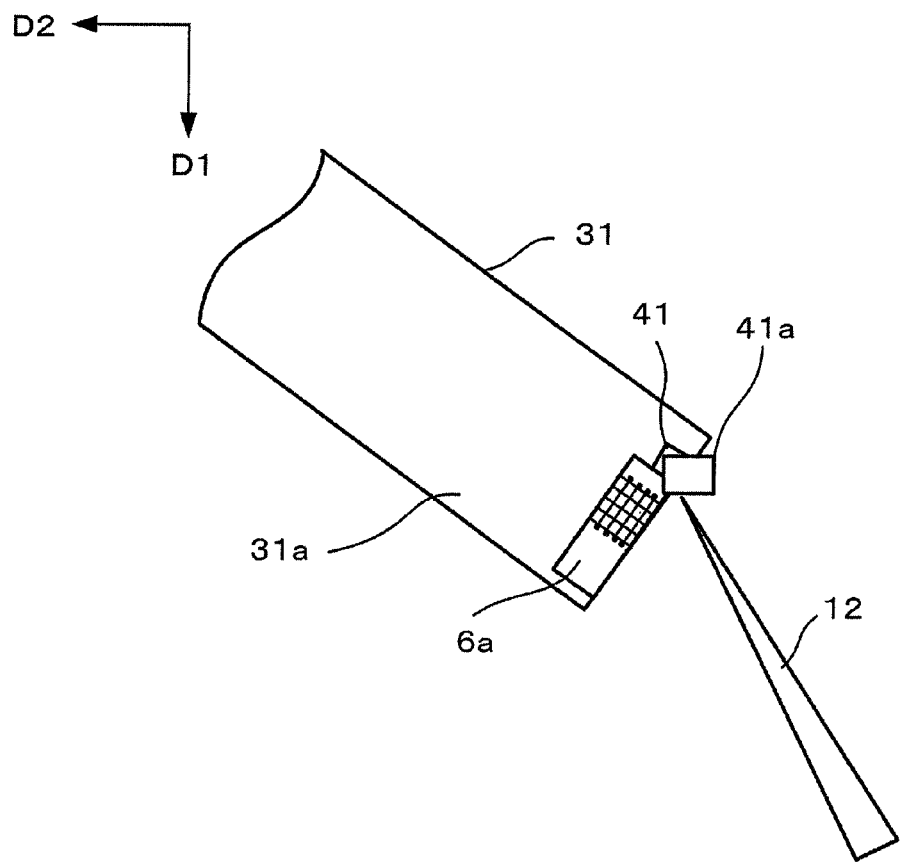

As shown in FIG. 21A, when the second sample stage 11 is tilted by 60°, the fixing unit 31 of the TEM sample holder 10 is tilted by 60° with respect to the irradiation axis of the FIB. Then, by forming a deposition film 41a by being irradiated with the FIB 2a or the electron beam 1a while supplying the deposition gas, the sample piece 6a is fixed to the probe 12 (refer to FIG. 21B). As shown in FIG. 22A, when the sample piece 6a is cut off from the fixing unit 31 and the second sample stage is tilted by −20° with respect to the irradiation axis of the FIB as shown in FIG. 22B, the fixing unit 31 of the TEM sample holder 10 is tilted by −20° with respect to the irradiation axis of the FIB. Then, a deposition film 42a is formed so as to fix the sample piece 6a. In addition, the electron beam 1a is incident on the surface of sample piece 6a and thus it is possible to manufacture the planar TEM sample which is used to perform the TEM observation.

Other Illustrative Embodiment

Figure 23:
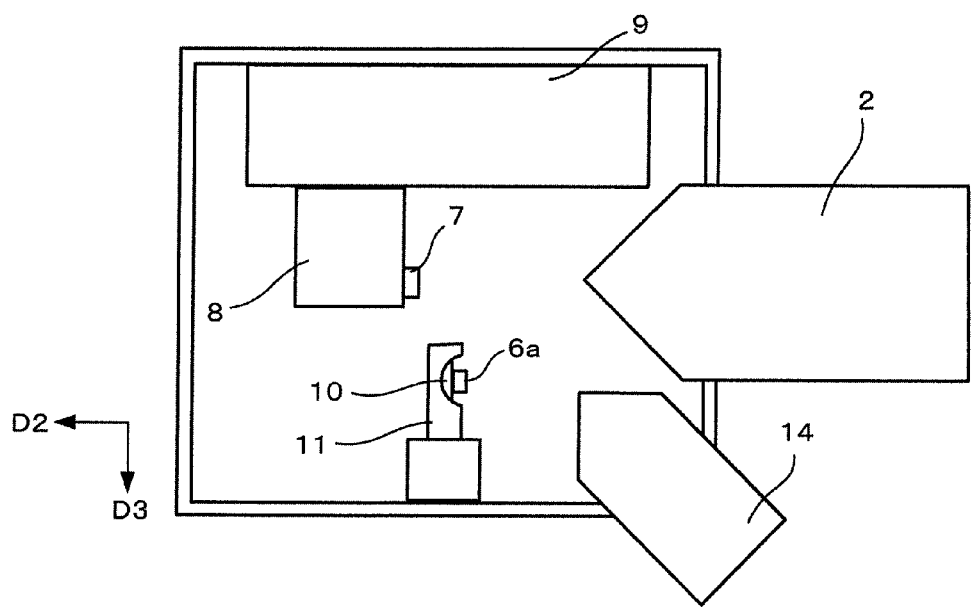
FIG. 23 is a diagram illustrating a configuration of a charged particle beam apparatus according to another illustrative embodiment of the present invention.

FIG. 23 shows a charged particle beam apparatus according to another illustrative embodiment. In this illustrative embodiment, the charged particle beam apparatus further includes a gas ion beam column 14. The gas ion beam column 14 is configured to irradiate the sample 6 with a gas ion beam so as to remove a damaged layer of the sample 6 and/or perform cleaning of an observation surface of the sample 6. Incidentally, argon, xenon, oxygen, etc., may be used as an ion source of the gas ion beam. The gas ion beam column 14 is disposed in a position between the FIB column 2 and the second sample stage 11. The gas ion beam column 14 is able to emit the gas ion beam in a plane formed by the D2 direction and the D3 direction (i.e., in a horizontal direction).

The gas ion beam column 14 is configured to irradiate the sample piece 6a, which is fixed to the fixing unit 31 of the TEM sample holder 10 of the second sample stage 11, with the gas ion beam, so as to remove a damaged layer of the sample piece 6a and/or perform cleaning of an observation surface of the sample piece 6a. When emitting the gas ion beam, the second sample stage 11 is tilted by an angle which enables irradiating a plane of the sample piece 6a with the gas ion beam from a predetermined angle (for example, 10°) with respect to said plane of the sample piece 6a which the gas ion beam is to be irradiated with. Accordingly, it becomes possible to irradiate an irradiated surface of the sample piece 6a with the gas ion beam from the constant angle, so that it becomes possible to perform the etching process efficiently. Further, since the gas ion beam column 14 and the FIB column 2 are disposed in a horizontal plane, even if the second sample stage 11 is tilted, the second sample stage 11 can be prevented from being interfered with the gas ion beam column 14 or the FIB column 2. Specifically, in a case of processing both surfaces of the sample piece 6a, by tilting the second sample stage 11 by ± predetermined angles with respect to the horizontal plane, it becomes possible to irradiate the both surfaces of the sample piece 6a with the gas ion beam, so that it becomes possible to process the both surfaces of the sample piece 6a without causing the interference. Incidentally, in FIG. 24, the probe 12 is provided below the gas ion beam column 14 and the FIB column 12 (far side in FIG. 14), so that the probe 12 does not interfere with the gas ion beam column 14 and the FIB column 2.

Figure 24:
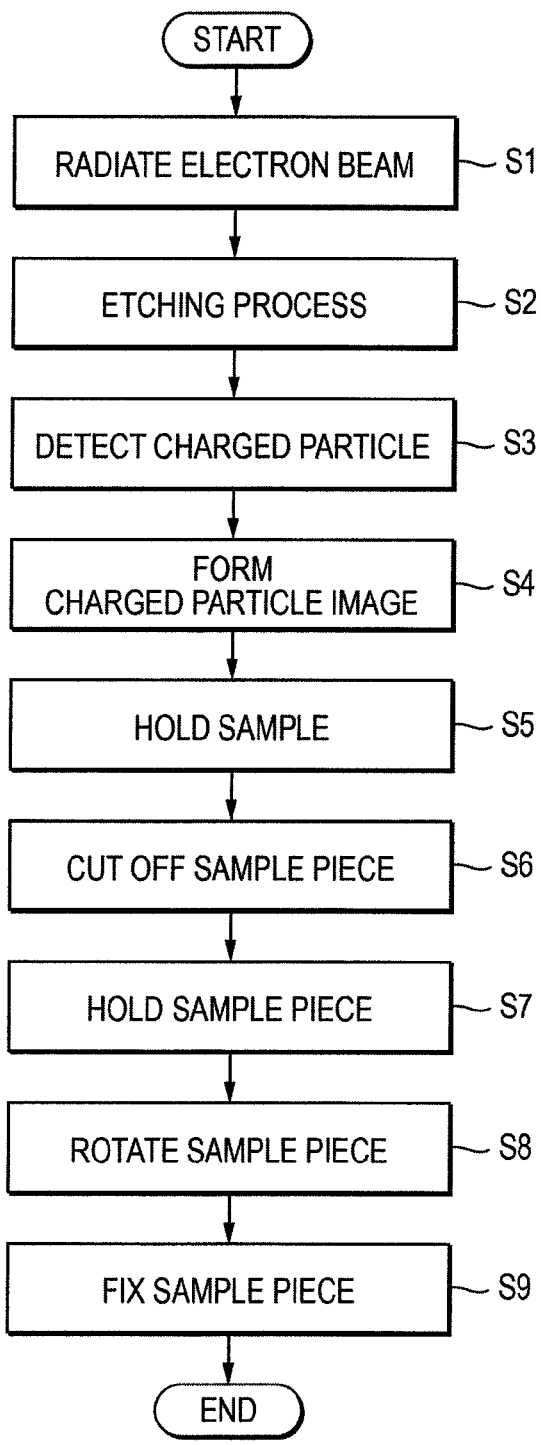
FIG. 24 is a flowchart illustrating an example of a sample observation method by means of a charged particle beam apparatus of the illustrative embodiment according to the invention.

With reference to a flowchart in FIG. 24, an example of a sample observation method by a charged particle beam apparatus will be described.

The electron beam column 1 irradiates the sample 6, which is fixed to the sample holder 7 of the first sample stage 8, with the electron beam 1a based on an instruction from the electron beam control unit 22 (step S1). Next, the FIB column 2 which is disposed to be substantially perpendicular to the electron beam column 1 irradiates the sample 6 with the FIB 2a based on the instruction of the FIB control unit 23, thereby performing the etching process for the sample 6 (step S2).

In addition, the secondary electron detection unit 4 detects the secondary electron generated from the sample 6 by being irradiated with the electron beam 1a or the FIB 2a. On the other hand, the transmission electron detection unit 5 detects the transmitted electron which is transmitted through the sample piece 6a and the electron beam 1a which is not incident on the sample piece 6a by irradiating a sample piece 6a with electron beam 1a (step S3). The detected data of the charged particle is transmitted to the image forming unit 24 so that the image forming unit 24 forms a charged particle image (step S4).

Next, the probe 12 holds the sample piece 6a based on the instruction of the probe control unit 26 (step S5) and retreats the first sample stage 8 and then cuts off the sample piece 6a from the sample 6 (step S6). In addition, the probe 12 holds the sample piece 6a which is cut off from the sample 6 (step S7), the probe 12 is rotated centering on the axial direction and the sample piece 6a is rotated at the same time (step S8), and then a sample piece 6a is fixed to the TEM sample holder 10 of the second sample stage 11 (step S9).

Note that the scope of the present invention is not limited to the above-described illustrative embodiment, and may be appropriately modified or reformed. In addition, each component element in the above-described illustrative embodiment is not limited to material, shape, size, dimension, form, number, placement location, or the like as long as a matter is capable of achieving the present invention.

What is claimed is:

1. A charged particle beam apparatus comprising:
    an electron beam column configured to irradiate a sample with an electron beam;
    an ion beam column, which is disposed substantially perpendicular to the electron beam column, and which is configured to irradiate the sample with an ion beam to perform an etching process;
    a detector configured to detect a charged particles generated from the sample;
    an image forming unit configured to form a charged particle image by using detection signals from the detector;
    a first sample stage, which is configured to hold the sample, and which is movable to be tilted;
    a second sample stage, which has a sample holder configured to hold a sample piece cut off from the sample, which is movable to be tilted, and which is configured to move the sample holder in a direction substantially perpendicular to an irradiation axis of the electron beam to an irradiated area of the electron beam; and
    a probe that is rotatable about an axis while holding the sample piece.

2. The charged particle beam apparatus according to claim 1, wherein a tilt axis of the first sample stage is disposed to be substantially parallel to a tilt axis of the second sample stage.

3. The charged particle beam apparatus according to claim 1, wherein the probe is configured to be driven independently from the first sample stage and the second sample stage.

4. The charged particle beam apparatus according to claim 1, wherein the probe is disposed closer than the first sample stage to the ion beam column.

5. The charged particle beam apparatus according to claim 1, wherein the detector is a transmission electron detection unit that is configured to detect the charged particles in a state where the sample is held in the first sample stage and the sample is held in the second sample stage.

6. The charged particle beam apparatus according to claim 1, wherein the second sample stage is configured to move the sample holder in a direction substantially perpendicular to an irradiation axis of the ion beam.

7. The charged particle beam apparatus according to claim 1, wherein the second sample stage accommodates therein the sample holder while exposing the sample holder around a position corresponding to an irradiated path of the electron beam when the sample holder is moved to the irradiated area of the electron beam.

8. A sample observation method comprising the steps of:
    irradiating a sample with an electron beam;
    irradiating the sample with an ion beam in a direction substantially perpendicular to the electron beam to perform an etching process;
    detecting a charged particles generated from the sample;
    forming a charged particle image by using detection signals from a detector;
    holding the sample;
    holding a sample piece, which is cut off from the sample, by a sample holder that has been moved to an irradiation axis of the electron beam; and
    rotating centering on an axial direction while holding the sample piece.

* * * * *